United States Patent
Kim et al.

(10) Patent No.: US 11,287,858 B2
(45) Date of Patent: Mar. 29, 2022

(54) METHOD OF FABRICATING A CIRCUIT BOARD AND A DISPLAY DEVICE INCLUDING A CIRCUIT BOARD

(71) Applicant: Samsung Display Co., Ltd., Yongin-Si (KR)

(72) Inventors: Byoungyong Kim, Seoul (KR);
Seongtaek Lee, Suwon-si (KR);
Young-Min Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/064,661

(22) Filed: Oct. 7, 2020

(65) Prior Publication Data

US 2021/0109573 A1 Apr. 15, 2021

(30) Foreign Application Priority Data

Oct. 14, 2019 (KR) ........................ 10-2019-0126925

(51) Int. Cl.
*G09G 3/20* (2006.01)
*G06F 1/18* (2006.01)
(Continued)

(52) U.S. Cl.
CPC ........... *G06F 1/189* (2013.01); *G09G 3/3275* (2013.01); *H01L 27/124* (2013.01);
(Continued)

(58) Field of Classification Search
CPC ....... G09G 3/3275; G06F 1/183; G06F 1/189;
G06F 1/637; G06F 1/1626; G06F 1/1652;
G02F 1/13452; H01L 27/124; H01L
27/3246; H01L 27/3248; H01L 27/3262;
H01L 27/3276; H01L 27/3279; H01L
2227/323; H05K 1/111; H05K 3/323;
H05K 2203/0361
See application file for complete search history.

(56) References Cited

U.S. PATENT DOCUMENTS 6,262,579 B1 * 7/2001 Chazan ............... H01L 21/4857
324/537
8,007,286 B1 * 8/2011 Holec .................. H05K 1/0293
439/65
(Continued)

FOREIGN PATENT DOCUMENTS

KR         100621550 B1    9/2006
KR       1020190021670 A   3/2019
(Continued)

*Primary Examiner* — Joe H Cheng
(74) *Attorney, Agent, or Firm* — Cantor Colburn LLP

(57) ABSTRACT

A display device may include a display panel including a signal pad and a circuit board including a connection pad having a first connection pad portion and a second connection pad portion. The second connection pad portion may be thicker than the first connection pad portion and may not be overlapped with the first connection pad portion in a plan view. The connection pad may be in contact with the signal pad. A first surface roughness between the first connection pad portion and the signal pad may be greater than a second surface roughness between the second connection pad portion and the signal pad.

20 Claims, 17 Drawing Sheets

(51) Int. Cl.
  *H01L 27/32* (2006.01)
  *G09G 3/3275* (2016.01)
  *H01L 27/12* (2006.01)
  *G06F 1/16* (2006.01)

(52) U.S. Cl.
  CPC ........ *H01L 27/3276* (2013.01); *G06F 1/1626* (2013.01); *H01L 2227/323* (2013.01)

(56) References Cited

U.S. PATENT DOCUMENTS

| | | | |
|---|---|---|---|
| 2005/0205524 A1 | 9/2005 | Lee et al. | |
| 2009/0298259 A1 | 12/2009 | Ling et al. | |
| 2014/0104528 A1* | 4/2014 | Jung | H01L 33/08 |
| | | | 349/43 |
| 2017/0098769 A1* | 4/2017 | Im | H01L 51/0031 |
| 2017/0117264 A1* | 4/2017 | Lee | H01L 24/17 |
| 2017/0358762 A1* | 12/2017 | Min | H01L 51/5281 |
| 2017/0358772 A1* | 12/2017 | Sung | H01L 27/3244 |
| 2019/0096979 A1* | 3/2019 | Jo | H01L 27/124 |
| 2019/0179463 A1* | 6/2019 | Lim | G06F 3/0416 |
| 2020/0022261 A1* | 1/2020 | Choi | H05K 3/0061 |
| 2020/0303850 A1* | 9/2020 | Roh | H01R 12/62 |
| 2020/0312761 A1 | 10/2020 | Jang | |
| 2020/0312940 A1 | 10/2020 | Jang | |
| 2021/0041922 A1* | 2/2021 | Jang | G06F 1/189 |
| 2021/0313411 A1* | 10/2021 | Jung | H01L 27/3223 |

FOREIGN PATENT DOCUMENTS

| KR | 1020200115756 A | 10/2020 |
|---|---|---|
| KR | 1020200115757 A | 10/2020 |

\* cited by examiner

METHOD OF FABRICATING A CIRCUIT BOARD AND A DISPLAY DEVICE INCLUDING A CIRCUIT BOARD

This application claims priority to Korean Patent Application No. 10-2019-0126925, filed on Oct. 14, 2019, and all the benefits accruing therefrom under 35 U.S.C. § 119, the content of which in its entirety is herein incorporated by reference.

BACKGROUND

1. Field

Exemplary embodiments of the invention relate to a display device, and in particular, to a method of fabricating a circuit board and a display device including a circuit board.

2. Description of Related Art

Various display devices are being developed to be uses in multimedia devices, such as televisions, mobile phones, tablet computers, navigation systems, and gaming machines.

The display device includes a display panel, which is used to display an image. The display panel includes a plurality of gate lines, a plurality of data lines, and a plurality of pixels connected to the gate and data lines. The display device further includes a circuit board providing electrical signals, which are desired to display the image, to the gate lines or the data lines.

The circuit board is electrically connected to the display panel using an anisotropic conductive film or an ultrasonography bonding process. In a case where the display panel and the circuit board are connected to each other by the ultrasonography bonding process, it is possible to improve a conduction property between the display panel and the circuit board and to simplify a fabrication process, compared with a case of using the anisotropic conductive film.

SUMMARY

An exemplary embodiment of the invention provides a method of fabricating a circuit board, which improves reliability in connection between a connection pad of the circuit board and a signal pad of a display panel, and a display device including the circuit board.

An exemplary embodiment of the invention provides a display device including a display panel including a signal pad and a circuit board including a connection pad having a first connection pad portion and a second connection pad portion. The second connection pad portion may be thicker than the first connection pad portion and may not be overlapped with the first connection pad portion in a plan view. The connection pad may be in contact with the signal pad. A first surface roughness between the first connection pad portion and the signal pad may be greater than a second surface roughness between the second connection pad portion and the signal pad.

In an exemplary embodiment, the connection pad may include a first conductive layer and a second conductive layer, which is disposed on the first conductive layer to expose a portion of the first conductive layer. The first connection pad portion may correspond to the portion of the first conductive layer exposed by the second conductive layer, and the second connection pad portion may correspond to a structure, in which the first and second conductive layers may be stacked.

In an exemplary embodiment, the first conductive layer may be thicker than the second conductive layer.

In an exemplary embodiment, the circuit board may further include a sub-conductive layer, which is disposed on a side surface of the first connection pad portion and includes the same material as a material of the second conductive layer.

In an exemplary embodiment, in a thickness direction of the display panel, a height of the sub-conductive layer may be smaller than a thickness of the first conductive layer.

In an exemplary embodiment, the first and second connection pad portions may be alternately and repeatedly arranged in a first direction in which the connection pad extends.

In an exemplary embodiment, the first conductive layer may be extended in the first direction as a unitary shape. The second conductive layer may include portions, which are arranged in the first direction to be spaced apart from each other by a predetermined distance.

In an exemplary embodiment, the first conductive layer may include a material different from a material of the second conductive layer.

In an exemplary embodiment, the circuit board may further include a base substrate, on which the connection pad is disposed, a driving chip disposed on the base substrate, and a connection line disposed on the base substrate to electrically connect the connection pad to the driving chip. The connection line may include a first conductive line layer corresponding to the first conductive layer and a second conductive line layer corresponding to the second conductive layer.

In an exemplary embodiment, the first conductive line layer and the first conductive layer may be unitarily shaped, and the second conductive line layer and the second conductive layer may be unitarily shaped.

In an exemplary embodiment, the first conductive layer may include copper, and the second conductive layer may include tin.

In an exemplary embodiment, in the plan view, an area of the first connection pad portion may be greater than an area of the signal pad.

An exemplary embodiment of the invention provides a display device including a display panel, in which a display region and a non-display region adjacent to the display region are defined, and a circuit board electrically connected to the display panel overlapped with the non-display region. The display panel may include a signal pad overlapped with the non-display region. The circuit board may include a conductive pattern including a pad portion, which faces the signal pad and is in contact with the signal pad, and a line portion, which is not overlapped with the signal pad and is connected to the pad portion. In a thickness direction of the display panel, a recessed space, which is recessed in a direction from a first surface of the pad portion facing the signal pad toward a second surface facing the first surface, may be defined in the pad portion.

In an exemplary embodiment, the pad portion may include a first conductive layer and a second conductive layer, which is disposed on the first conductive layer to expose a portion of the first conductive layer. The recessed space may be defined in the portion of the first conductive layer exposed by the second conductive layer.

In an exemplary embodiment, a first surface roughness between the signal pad and the exposed portion of the first conductive layer, which are in contact with each other, may be greater than a second surface roughness between the signal pad and the second conductive layer, which are in contact with each other.

In an exemplary embodiment, the line portion may include a first line conductive layer having a unitary shape in conjunction with the first conductive layer, and a second line conductive layer disposed on the first line conductive layer and having a unitary shape in conjunction with the second conductive layer.

In an exemplary embodiment, the first conductive layer may be thicker than the second conductive layer, and the first conductive layer may include a material different from a material of the second conductive layer.

An exemplary embodiment of the invention provides a method of fabricating a circuit including preparing a base substrate, in which a pad region and a line region are defined, the pad region and the line region being divided into each other in a plan view, forming a first conductive layer on the base substrate, removing a region of the first conductive layer, which is not overlapped with the pad region and the line region, forming a second conductive layer on the base substrate to cover the first conductive layer, and removing a region of the second conductive layer, which is overlapped with the pad region, using an intense light. As a result of the using the intense light, a portion of the first conductive layer overlapped with the pad region may be exposed by the second conductive layer.

In an exemplary embodiment, the method may further include irradiating the intense light onto a first surface of the first conductive layer, which is overlapped with the pad region. A recessed space, which is recessed in a direction from the first surface of the first conductive layer toward a second surface facing the first surface, may be defined in the first conductive layer, as a result of the using the intense light.

In an exemplary embodiment, the first conductive layer and the second conductive layer may include different materials from each other, and the second conductive layer may expose a portion of the base substrate, which is not overlapped with the first conductive layer.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

DETAILED DESCRIPTION

Figure 1:
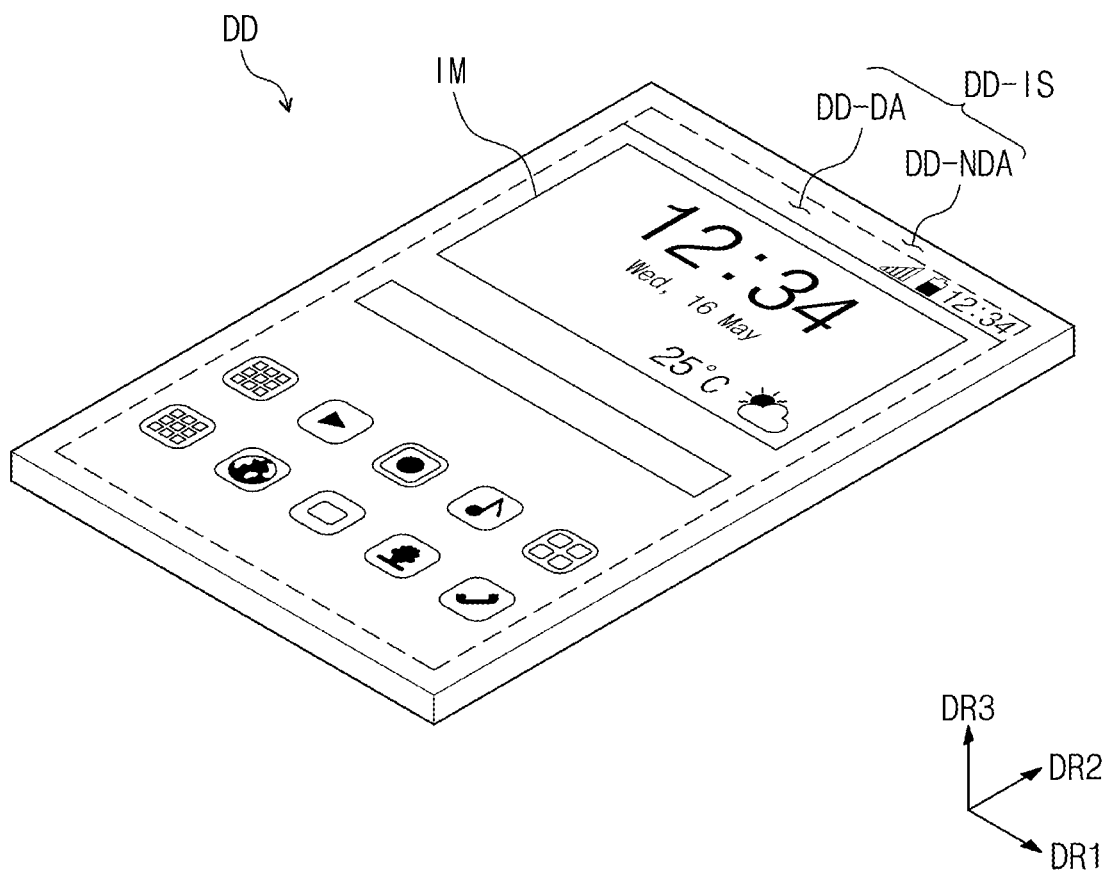
FIG. 1 is a perspective view illustrating an exemplary embodiment of a display device according to the invention.

Exemplary embodiments of the invention will now be described more fully with reference to the accompanying drawings, in which exemplary embodiments are shown. Exemplary embodiments of the invention may, however, be embodied in many different forms and should not be construed as being limited to the exemplary embodiments set forth herein; rather, these embodiments are provided so that the invention will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the invention are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
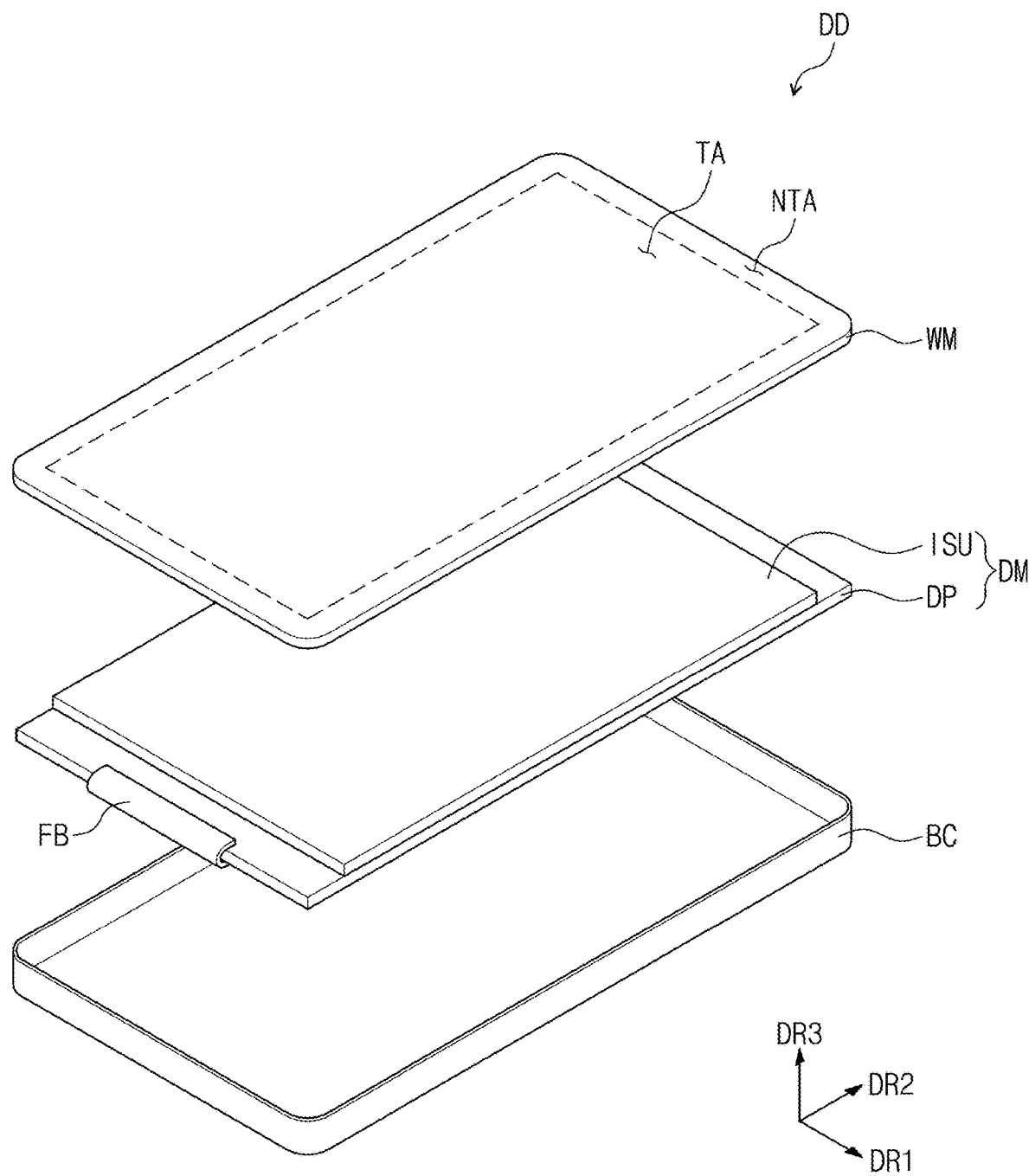
FIG. 2 is an exploded perspective view illustrating an exemplary embodiment of a display device according to the invention.

FIG. 1 is a perspective view illustrating an exemplary embodiment of a display device according to the invention. FIG. 2 is an exploded perspective view illustrating an exemplary embodiment of a display device according to the invention.

Referring to FIG. 1, a display device DD may include a display surface DD-IS, which is used to display an image IM. The display device DD with a flat display surface DD-IS is illustrated in FIG. 1, but the invention is not limited to this example. The display device DD may include a curved or three-dimensional ("3D") display surface. In the case where the display device DD includes the 3D display surface, the display surface DD-IS may include a plurality of display regions that are oriented in different directions. In an exemplary embodiment, the display surface DD-IS may include a polygonal-pillar-shaped surface, for example.

In an exemplary embodiment, the display device DD may be a flexible display device. However, the invention is limited to this example, and in another exemplary embodiment, the display device DD may be a rigid display device.

Although not shown, the display device DD may constitute a mobile phone, along with an electronic module, a camera module, and a power module, which are disposed (e.g., mounted) on a mainboard and are provided in a bracket or case. The display device DD may be used for large-sized electronic devices (e.g., television sets and monitors) or small- or medium-sized electronic devices (e.g., tablets, car navigation systems, game machines, and smart watches).

The display surface DD-IS may be parallel to a plane defined by a first direction DR1 and a second direction DR2. A direction normal to the display surface DD-IS (i.e., a thickness direction of the display device DD) will be referred to as a third direction DR3. In the specification, the expressions "in a plan view" and "a planar area" may be used to describe a shape and an area of an object viewed in the third direction DR3. Hereinafter, a front or top surface of each element, member, or unit from a back or bottom surface will be differentiated from each other, based on the third direction DR3. However, directions indicated by the first to third directions DR1, DR2, and DR3 may not be limited to this example, and, in exemplary embodiments, the first to third directions DR1, DR2, and DR3 may be changed to indicate other or opposite directions.

As shown in FIG. 1, the display surface DD-IS may include a display region DD-DA, on which the image IM is displayed, and a non-display region DD-NDA, which is adjacent to the display region DD-DA. The non-display region DD-NDA may not be used to displayer an image. In FIG. 1, application icons and a clock window are illustrated as an example of the image IM.

As shown in FIG. 1, the display region DD-DA may be rectangular or tetragonal, and the non-display region DD-NDA may enclose the display region DD-DA. However, the invention is not limited to this example, and the shapes of the display and non-display regions DD-DA and DD-NDA may be variously changed in a mutually influential manner. In another exemplary embodiment, the non-display region DD-NDA may be locally provided near only one side portion of the display region DD-DA or may be omitted, for example.

Referring to FIG. 2, the display device DD may include a window WM, a display module DM, a circuit board FB, and a housing member BC.

The window WM may be disposed on the display module DM and may transmit an image, which is provided from the display module DM, through a transmission region TA. The window WM may include the transmission region TA and a non-transmission region NTA. The transmission region TA may have a shape corresponding to the display region DD-DA shown in FIG. 1. Accordingly, the image IM, which is displayed on the display region DD-DA of the display device DD, may be provided to a user through the transmission region TA of the window WM.

The non-transmission region NTA may have a shape corresponding to the non-display region DD-NDA shown in FIG. 1. The non-transmission region NTA may have relatively low optical transmittance, compared with the transmission region TA. However, the invention is not limited to this example, and in another exemplary embodiment, the non-transmission region NTA may be omitted.

In an exemplary embodiment, the window WM may include, for example, glass, sapphire, plastic, or the like. Although the window WM is illustrated to have a single-layered structure, the window WM may include a plurality of layers. The window WM may include a base layer and at least one printing layer, which is disposed on a rear surface of the base layer and is overlapped with the non-transmission region NTA. The printing layer may have a predetermined color. As an example, the printing layer may have a black color or other colors.

The display module DM may be disposed between the window WM and the housing member BC. The display module DM may include a display panel DP and an input-sensing unit ISU.

The display panel DP may generate an image and transmit the generated image to the window WM. In an exemplary embodiment, the display panel DP may be an organic light emitting display panel, a liquid crystal display panel, or a quantum dot light-emitting display panel, but the invention is not limited to these examples. The organic light emitting display panel may include organic light emitting devices. The liquid crystal display panel may include liquid crystal molecules. The quantum dot light-emitting display panel may include quantum dots or quantum rods.

Hereinafter, an example, in which the display panel DP is an organic light emitting display panel, will be described. However, the invention is not limited to this example, and in another exemplary embodiment, the invention may be applied to realize various display panels.

The input-sensing unit ISU may be disposed between the window WM and the display panel DP. The input-sensing unit ISU may sense an input provided from the outside. Such an external input may be provided in various shapes. In an exemplary embodiment, the external input may include various types of external inputs, such as a part of a user's body, a stylus pen, light, heat, or pressure, for example. The external input may include a non-touching-type event (e.g., a hovering event near the input-sensing unit ISU), in addition to such a touching-type event caused by the user's hand.

The input-sensing unit ISU may be directly disposed on the display panel DP. In the specification, the expression "an element A may be directly disposed on an element B" means that an adhesive layer is not disposed between the elements A and B. In the illustrated exemplary embodiment, the input-sensing unit ISU and the display panel DP may be fabricated through a consecutive process. However, the invention is not limited to this example, and in another exemplary embodiment, the input-sensing unit ISU may be provided in the form of an individual panel and may be connected to the display panel DP using an adhesive layer. In another exemplary embodiment, the input-sensing unit ISU may be omitted.

The circuit board FB may be connected to an end of the display panel DP to provide driving signals to the display panel DP. In an exemplary embodiment, the circuit board FB may be a flexible circuit board, and the driving signals may be used to control an image displaying operation of the display panel DP. In addition, although not shown, a driving circuit board may be connected to an end of the circuit board FB to provide the driving signals to the circuit board FB. The circuit board FB may be disposed between the display panel DP and the driving circuit board to provide the driving signals, which are transmitted from the driving circuit board, to the display panel DP.

FIG. 2 illustrates a structure, in which the circuit board FB is connected to the display panel DP, but the invention is not limited to this example or an illustrated exemplary embodiment. In an exemplary embodiment, the display device DD may further include a touch circuit board, which is connected to the input-sensing unit ISU, and the touch circuit board may provide touch driving signals to the input-sensing unit ISU. In addition, a method of bonding the circuit board FB to the display panel DP may be substantially the same as the method of bonding the touch circuit board to the input-sensing unit.

The housing member BC may be coupled with the window WM. The housing member BC may be disposed on a rear surface of the display device DD and may be coupled to the window WM to define an internal space. The housing member BC may consist of or include a material having a relatively high stiffness or strength. In an exemplary embodiment, the housing member BC may include a plurality of frames and/or plates, each of which includes at least one of glass, plastic, or metallic materials, for example. The housing member BC may stably protect components of the display device DD, which are disposed in the internal space, from an external impact.

The housing member BC is described to include a highly stiff material, but, in an exemplary embodiment, the housing member BC may consist of or include a flexible material. Although not shown, the display device DD in an exemplary embodiment of the invention may have a foldable or bendable property. In this case, components in the display device DD may also have a flexible property.

Figure 3:
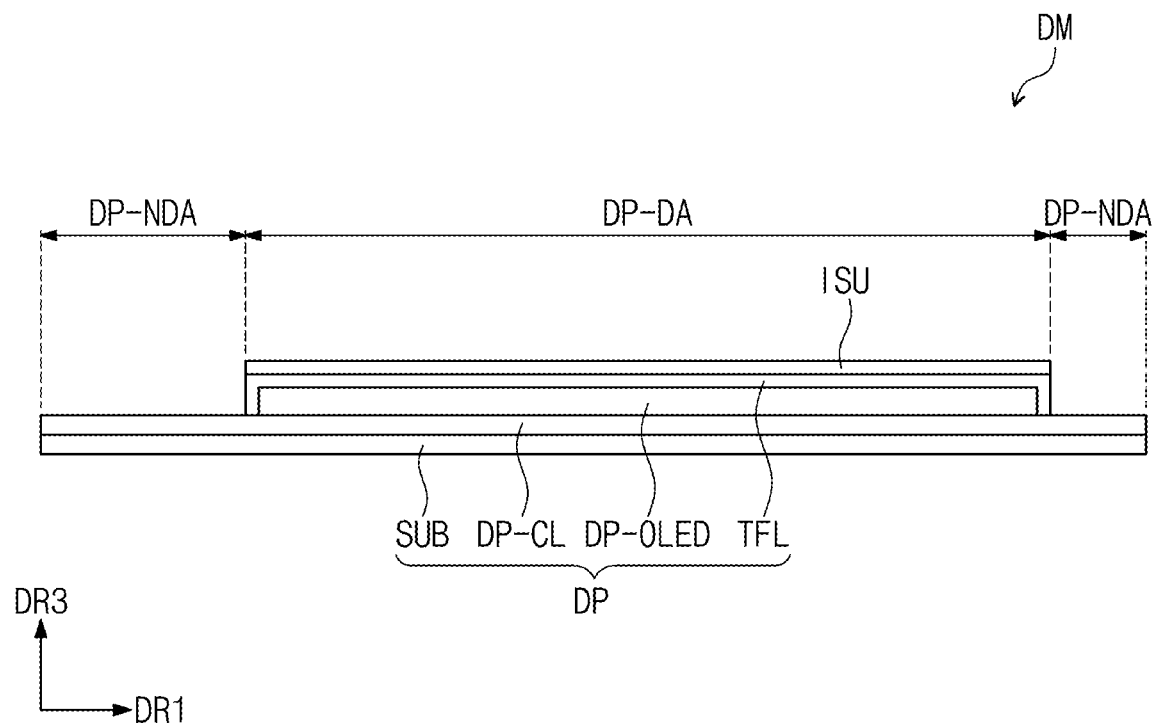
FIG. 3 is a cross-sectional view illustrating an exemplary embodiment of a display device according to the invention.
Figure 4A:
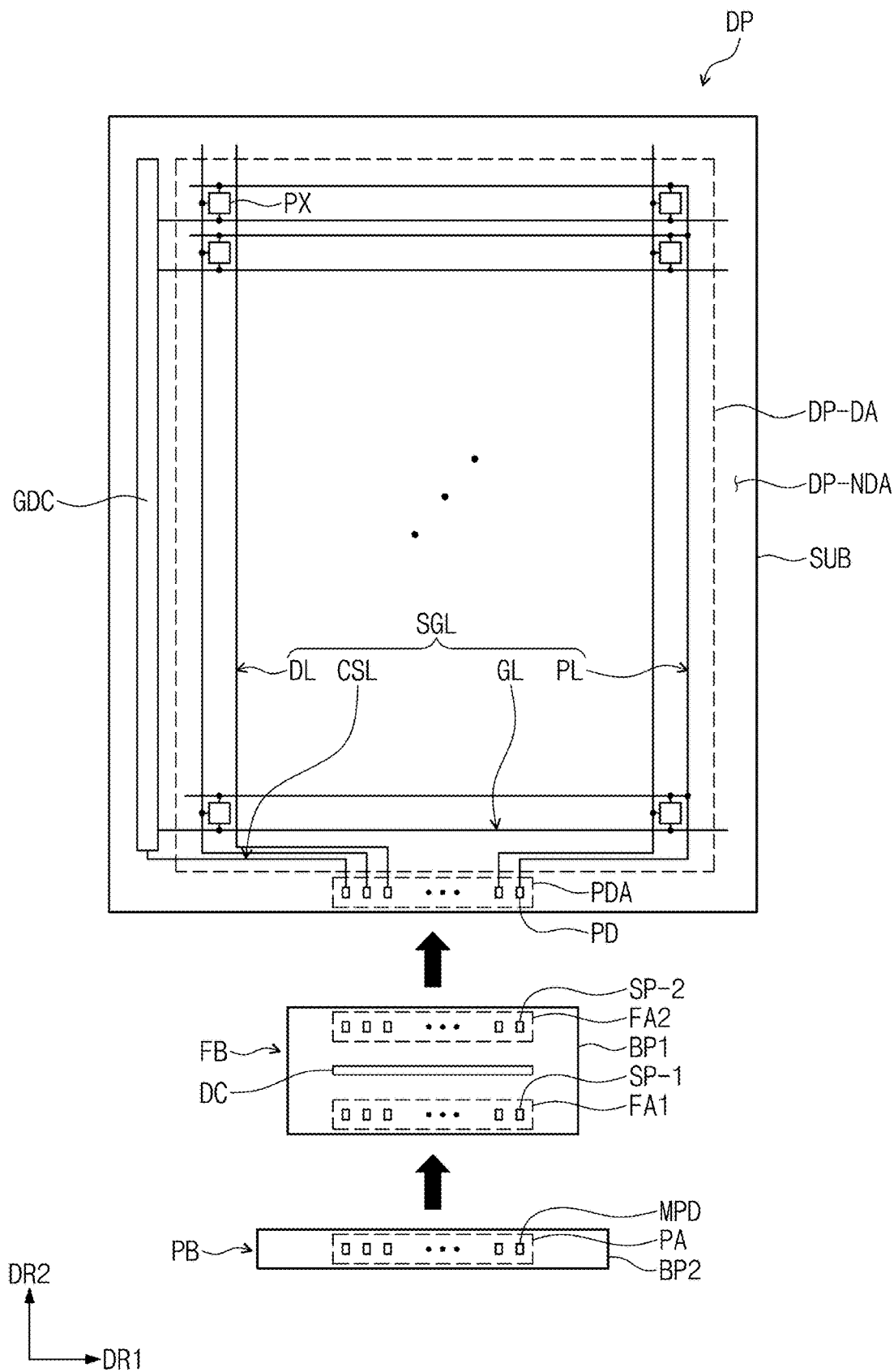
FIG. 4A is a plan view illustrating an exemplary embodiment of a display panel according to the invention.
Figure 4B:
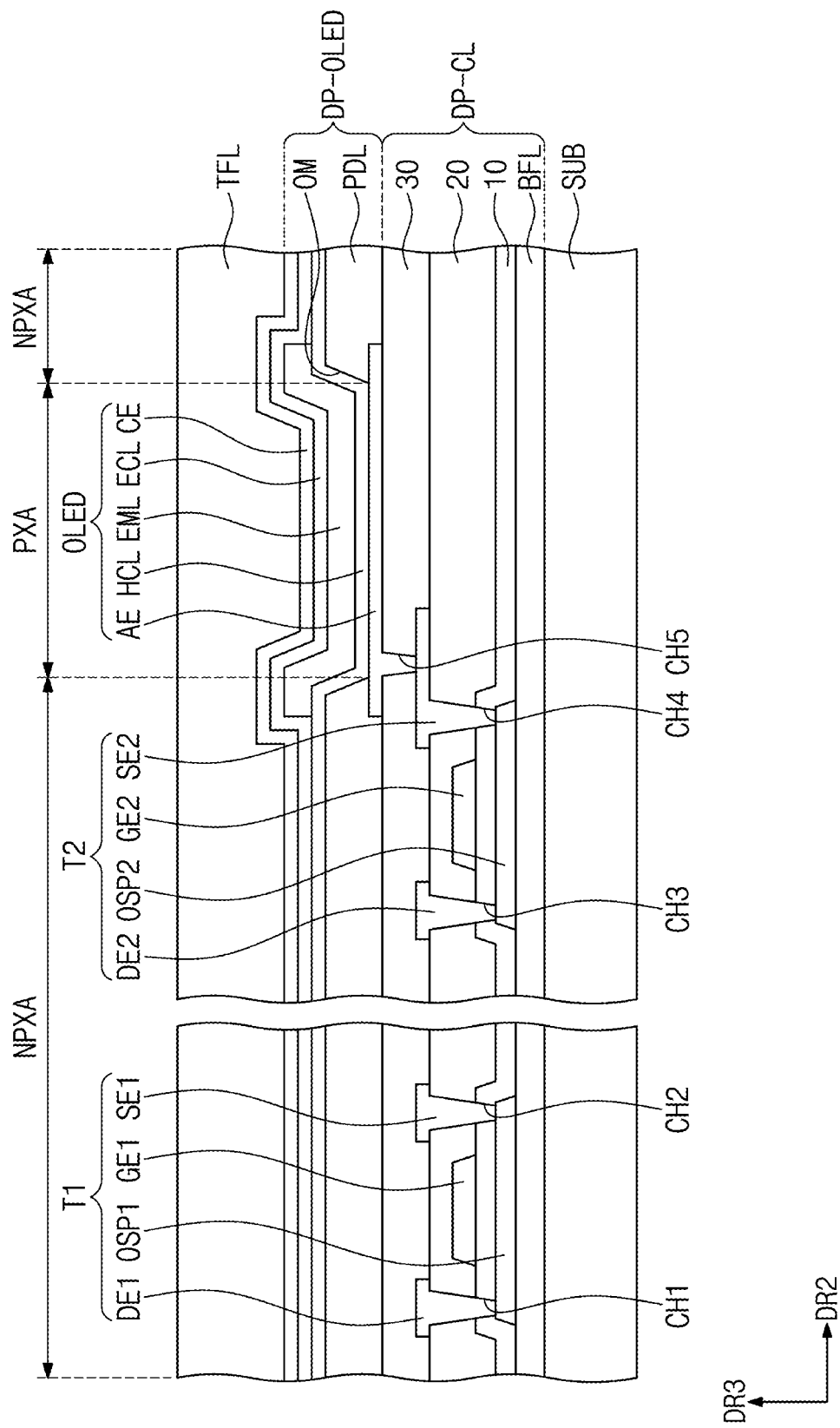
FIG. 4B is a cross-sectional view illustrating an exemplary embodiment of a portion of a display panel according to the invention.

FIG. 3 is a cross-sectional view illustrating an exemplary embodiment of a display device according to the invention. FIG. 4A is a plan view illustrating an exemplary embodiment of a display panel according to the invention. FIG. 4B is a cross-sectional view illustrating an exemplary embodiment of a portion of a display panel according to the invention.

Referring to FIG. 3, the display region DD-DA and the non-display region DD-NDA of the display device DD shown in FIG. 1 may correspond to a display region DP-DA and a non-display region DP-NDA, respectively, which are defined in the display panel DP.

The display panel DP may include a substrate SUB, and a circuit device layer DP-CL, a display device layer DP-OLED, and an insulating layer TFL, which are disposed on the substrate SUB.

The substrate SUB may include at least one plastic film. The substrate SUB may be a flexible substrate and may include a plastic substrate, a glass substrate, a metal substrate, or a substrate including an organic/inorganic composite material.

The circuit device layer DP-CL may include at least one intermediate insulating layer and a circuit device. In an exemplary embodiment, the intermediate insulating layer may include at least one intermediate inorganic layer and at least one intermediate organic layer. The circuit device may include signal lines, a pixel driving circuit, and so forth.

The display device layer DP-OLED may include a plurality of organic light emitting diodes. The display device layer DP-OLED may further include an organic layer such as a pixel definition layer. In an alternative exemplary embodiment, the display panel may be a liquid crystal display panel, and in this case, the display device layer may include a liquid crystal layer.

The insulating layer TFL may hermetically seal or encapsulate the display device layer DP-OLED. As an example, the insulating layer TFL may be a thin encapsulation layer. The insulating layer TFL may protect the display device layer DP-OLED from a contamination material, such as moisture, oxygen, and dust particles. FIG. 3 illustrates an example, in which the insulating layer TFL is overlapped with the display region DP-DA, but the invention is not limited to this example. In an exemplary embodiment, the insulating layer TFL may be overlapped with the non-display region DP-NDA, for example.

Referring to FIG. 4A, the display device DD may include the display panel DP, the circuit board FB electrically connected to the display panel DP, and a driving circuit board PB electrically connected to the circuit board FB.

The display panel DP may include a gate driving circuit GDC, a plurality of signal lines SGL, a plurality of signal pads PD overlapped with a pad region PDA, and a plurality of pixels PX.

The pixels PX may be disposed in the display region DP-DA. Each of the pixels PX may include an organic light emitting diode and a pixel driving circuit connected thereto.

The gate driving circuit GDC, the signal lines SGL, the signal pads PD, and the pixel driving circuit may be included in the circuit device layer DP-CL of FIG. 3.

The gate driving circuit GDC may generate gate signals and then may output the generated gate signals to a plurality of gate lines GL, which will be described below. The gate driving circuit GDC may include a plurality of thin film transistors, which are provided by the same process (e.g., a low temperature polycrystalline silicon ("LTPS") process or a low temperature polycrystalline oxide ("LTPO") process) as that for the pixel driving circuit of the pixels PX.

The signal lines SGL may be disposed on the substrate SUB and may be overlapped with the display region DP-DA and the non-display region DP-NDA. The signal lines SGL may include gate lines GL, data lines DL, a power line PL, and a control signal line CSL. Each of the gate lines GL may be connected to corresponding ones of the pixels PX, each of the data lines DL may be connected to corresponding ones of the pixels PX. The power line PL may be connected to the pixels PX. The control signal line CSL may provide control signals to the gate driving circuit GDC.

The signal lines SGL are described to be distinct from the signal pads PD, but the invention is not limited to this example. The signal lines SGL and the signal pads PD may be disposed on the substrate SUB by the same process and, in exemplary embodiments, the signal line SGL and the signal pad PD may be connected to form a unitary shape.

The circuit board FB may include a first base substrate BP1, first connection pads SP-1, second connection pads SP-2, and a driving chip DC. The circuit board FB may be connected to an end of the display panel DP, which is overlapped with the non-display region DP-NDA, and an end of the driving circuit board PB. The circuit board FB may have a flexible property, as described above. In an exemplary embodiment, as shown in FIG. 2, the circuit board FB may be bent along a side surface of the display panel DP, and in this case, a portion of the circuit board FB may be disposed on a rear surface of the display panel DP, for example.

In FIG. 4A, the circuit board FB is illustrated to be separated from the display panel DP and the driving circuit board PB, but the circuit board FB may be connected to a portion of the non-display region DP-NDA of the display panel DP and a portion of the driving circuit board PB.

The first base substrate BP1 may include a first pad region FA1, in which the first connection pads SP-1 are disposed, and a second pad region FA2, in which the second connection pads SP-2 are disposed. The first connection pads SP-1 may be input pads, which receive driving signals from the driving circuit board PB, and the second connection pads SP-2 may be output pads, which output electrical signals to the display panel DP. The first connection pads SP-1 may be arranged in the first direction DR1 to be spaced apart from each other by a predetermined distance, and the second connection pads SP-2 may also be arranged in the first direction DR1 to be spaced apart from each other by a predetermined distance.

In an exemplary embodiment, the second connection pads SP-2 of the circuit board FB may be respectively disposed to be in contact with the signal pads PD of the display panel DP and to face the signal pads PD of the display panel DP. According to some exemplary embodiments of the invention, the second connection pads SP-2 and the signal pads PD may be electrically connected to each other by an ultrasonography bonding method. In an exemplary embodiment, the ultrasonography bonding method may be a method of directly bonding two different metallic materials using at least one of heat, pressure, and ultrasonic vibration, for example. This will be described in more detail below.

The driving circuit board PB may include a second base substrate BP2 and driving pads MPD, which are disposed on the second base substrate BP2. The driving pads MPD may be disposed on a driving pad region PA, which is defined in the second base substrate BP2.

In an exemplary embodiment, the first connection pads SP-1 of the circuit board FB may be respectively connected to the driving pads MPD of the driving circuit board PB by an ultrasonography bonding process. However, the invention is not limited to this example, and in another exemplary embodiment, the first connection pads SP-1 and the driving pads MPD may be electrically connected to each other using an anisotropic conductive film ("ACF"). Although not shown, the driving circuit board PB may include a controller, which provides a plurality of driving signals to the circuit board FB through the driving pads MPD.

The driving chip DC may be disposed between the first connection pads SP-1 and the second connection pads SP-2, in a plan view. In other words, the first connection pads SP-1 and the second connection pads SP-2 may be spaced apart from each other with the driving chip DC interposed therebetween.

The driving chip DC may receive the driving signals, which are transmitted from the driving circuit board PB through the first connection pads SP-1, and may output data signals, which will be provided to the pixels PX, based on the received driving signals. The data signals, which are output from the driving chip DC, may be transmitted to the signal pads PD through the second connection pads SP-2. The signal pads PD may be used to respectively transmit the data signals, which are transmitted from the driving chip DC, to the data lines DL of the signal lines SGL.

Referring to FIG. 4B, the circuit device layer DP-CL may be disposed on the substrate SUB. The circuit device layer DP-CL may include at least one insulating layer and a circuit device. The circuit device may include signal lines, a pixel driving circuit, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The circuit device layer DP-CL may include a buffer layer BFL, a first intermediate inorganic layer 10, and a second intermediate inorganic layer 20, which include inorganic materials, and an intermediate organic layer 30, which includes an organic material. The buffer layer BFL may include a plurality of stacked inorganic layers.

In an exemplary embodiment, the pixel driving circuit may include at least two transistors T1 and T2, which are used to drive an organic light emitting diode OLED of the display device layer DP-OLED. As shown in FIG. 4B, such transistors T1 and T2 may include a switching transistor T1 and a driving transistor T2. The switching transistor T1 may be connected to the gate line GL and the data line DL to control operations of the driving transistor T2. The driving transistor T2 may be connected to the organic light emitting diode OLED of the display device layer DP-OLED to control operations of the organic light emitting diode OLED.

The switching transistor T1 may include a first semiconductor pattern OSP1, a first control electrode GE1, a first input electrode DE1, and a first output electrode SE1, and the driving transistor T2 may include a second semiconductor pattern OSP2, a second control electrode GE2, a second input electrode DE2, and a second output electrode SE2.

First and second penetration holes CH1 and CH2 may be defined in the circuit device layer DP-CL to electrically connect the first control electrode GE1 and the first output electrode SE1 of the switching transistor T1 to the first semiconductor pattern OSP1. Third and fourth penetration holes CH3 and CH4 may be defined in the circuit device layer DP-CL to electrically connect the second control electrode GE2 and the second output electrode SE2 of the driving transistor T2 to the second semiconductor pattern OSP2.

The display device layer DP-OLED may include the organic light emitting diode OLED. The display device layer DP-OLED may include a pixel definition layer PDL. In an exemplary embodiment, the pixel definition layer PDL may be an organic layer.

A first electrode AE may be disposed on the intermediate organic layer 30. The first electrode AE may be connected to the second output electrode SE2 through a fifth penetration hole CH5 penetrating the intermediate organic layer 30. A light-emitting opening OM may be defined in the pixel definition layer PDL. The light-emitting opening OM of the pixel definition layer PDL may be exposed at least a portion of the first electrode AE.

The display panel DP may include a pixel region PXA and a non-pixel region NPXA adjacent to the pixel region PXA. The pixel region PXA may be a region, which is used to emit light to the outside, and on which an image is recognized by a user. The non-pixel region NPXA may enclose the pixel region PXA. In the illustrated exemplary embodiment, the pixel region PXA may be defined to correspond to a portion of the first electrode AE exposed by the light-emitting opening OM.

A hole control layer HCL may be disposed in both of the pixel region PXA and the non-pixel region NPXA. The hole control layer HCL may include a hole transport layer and, in an exemplary embodiment, the hole control layer HCL may further include a hole injection layer. An emission layer EML may be disposed on the hole control layer HCL.

The emission layer EML may be disposed in a region corresponding to the light-emitting opening OM. The emission layer EML may consist of or include at least one of organic or inorganic materials. The emission layer EML may generate light of a predetermined color. In an exemplary embodiment, the emission layer EML may be provided as a unitary shape and may be disposed on the hole control layer HCL. In an exemplary embodiment, the emission layer EML as the unitary shape may be disposed in both of the pixel region PXA and the non-pixel region NPXA, for example. However, the invention is not limited to this example, and in another exemplary embodiment, and the emission layer EML may include a plurality of patterns, which are disposed in the pixel regions PXA, respectively.

An electron control layer ECL may be disposed on the emission layer EML. The electron control layer ECL may include an electron transport layer and, in an exemplary embodiment, the electron control layer ECL may further include an electron injection layer. The hole control layer HCL and the electron control layer ECL may be provided using an open mask, and thus, the hole control layer HCL and the electron control layer ECL may be provided in common on a plurality of pixels. A second electrode CE may be disposed on the electron control layer ECL. The second electrode CE may be a single pattern, which is disposed in common on the electron control layers ECL that are respectively included in the plurality of pixels.

The insulating layer TFL may be disposed on the second electrode CE. The insulating layer TFL may be provided as a single encapsulation layer and may include a plurality of thin films.

Figure 5:
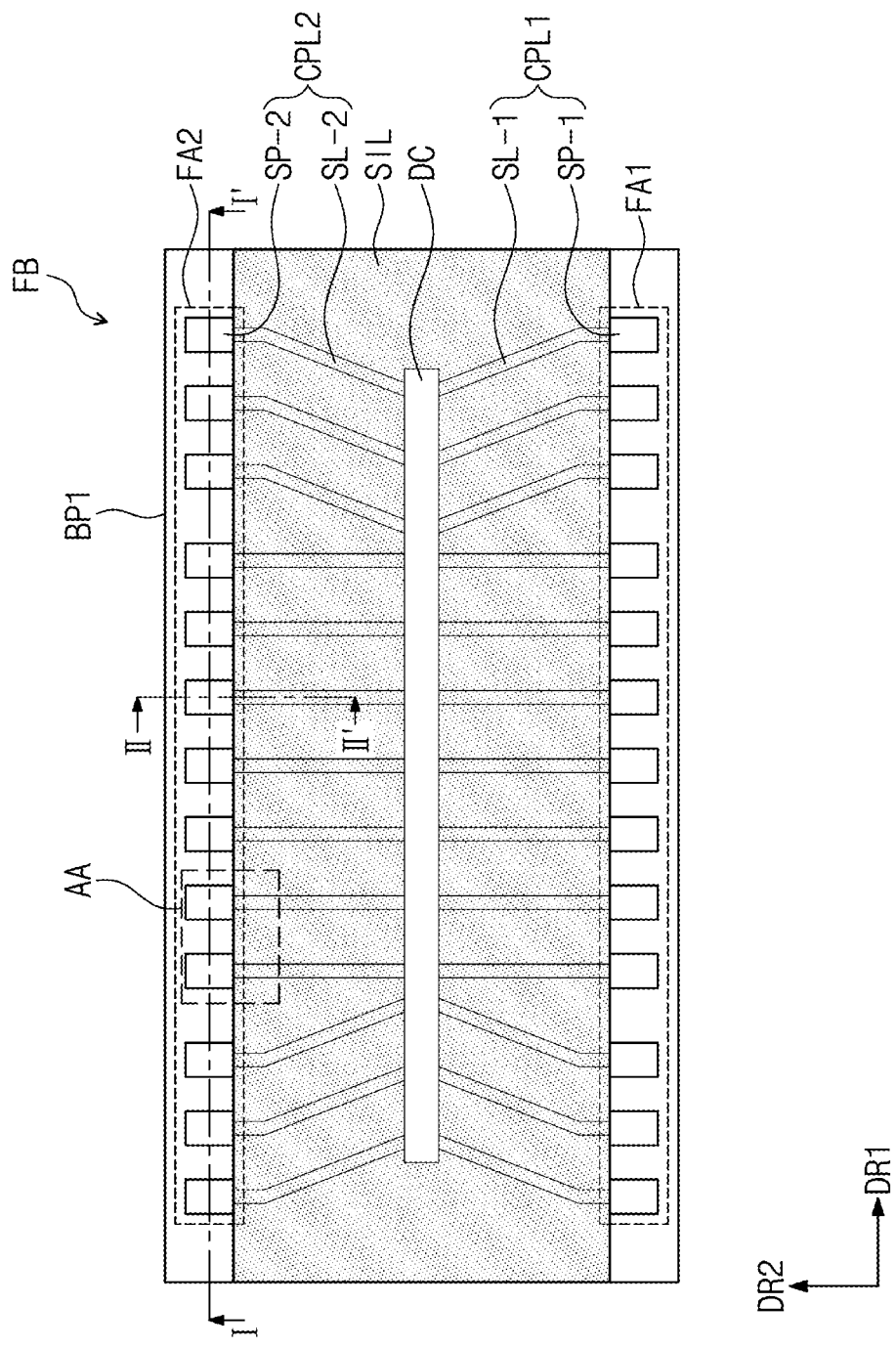
FIG. 5 is a plan view illustrating an exemplary embodiment of a circuit board according to the invention.
Figure 6:
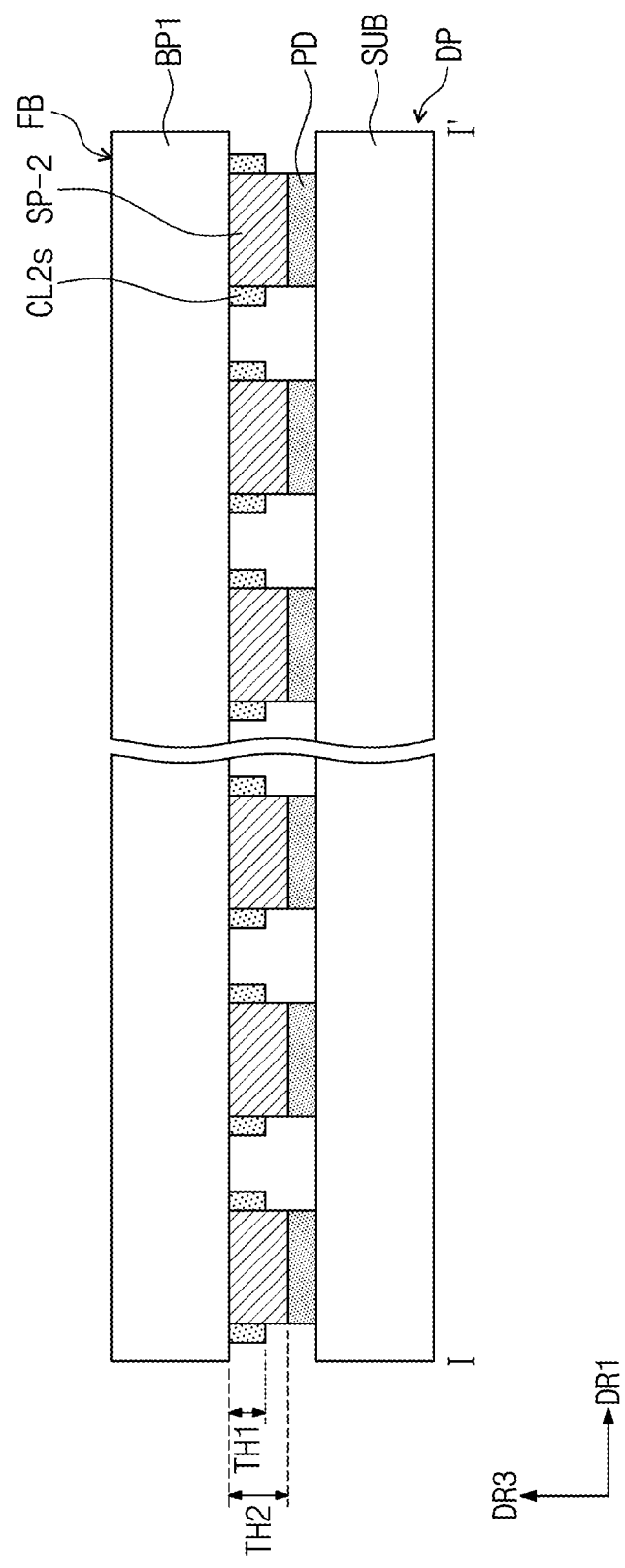
FIG. 6 is a cross-sectional view of an exemplary embodiment of a display device according to the invention, taken along line I-I' of FIG. 5.
Figure 7A:
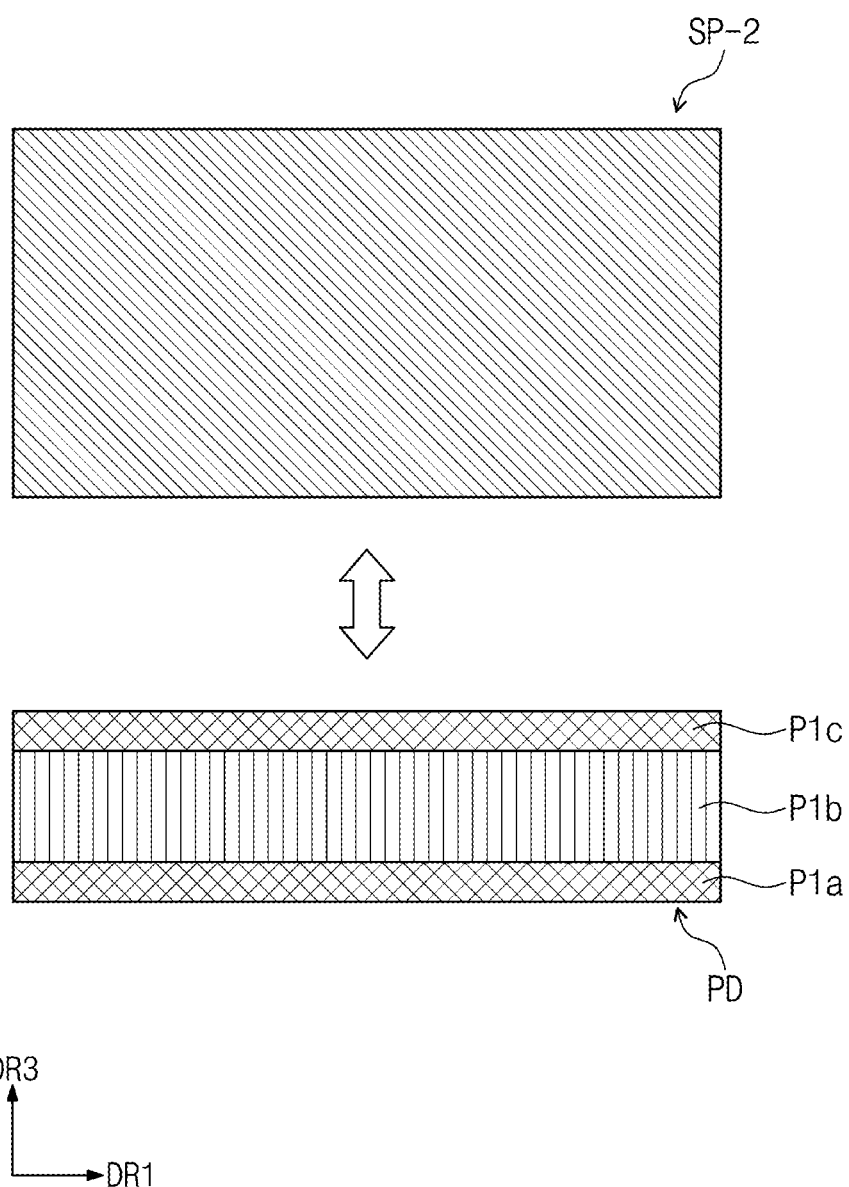
FIG. 7A is a cross-sectional view illustrating an exemplary embodiment of a connection pad and a signal pad according to the invention.
Figure 7B:
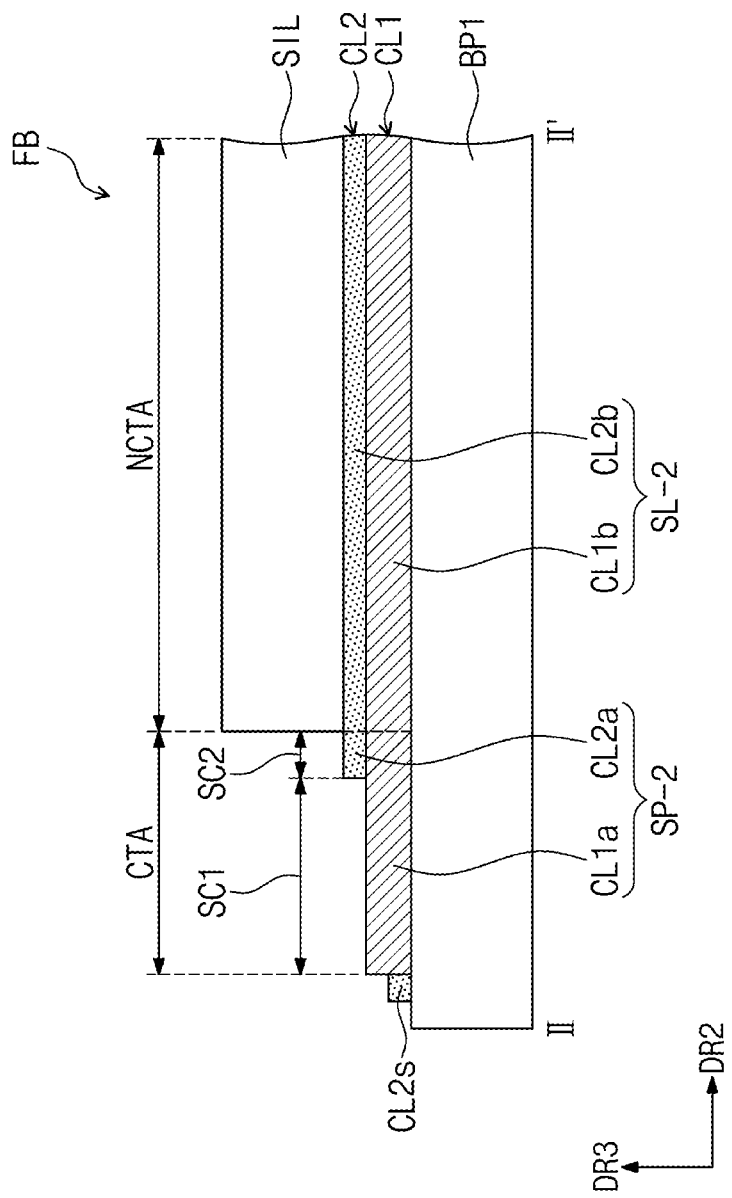
FIG. 7B is a cross-sectional view of an exemplary embodiment of a circuit board according to the invention, taken along line of FIG. 5.

FIG. 5 is a plan view illustrating an exemplary embodiment of a circuit board according to the invention. FIG. 6 is a cross-sectional view of an exemplary embodiment of a display device according to the invention, taken along line I-I' of FIG. 5. FIG. 7A is a cross-sectional view illustrating an exemplary embodiment of a connection pad and a signal pad according to the invention. FIG. 7B is a cross-sectional view of an exemplary embodiment of a circuit board according to the invention, taken along line II-II' of FIG. 5.

Referring to FIG. 5, the circuit board FB may further include first conductive patterns CPL1, and second connection lines SL-2, in addition to the driving chip DC.

The first conductive patterns CPL1 may include the first connection lines SL-1 and the first connection pads SP-1. In an exemplary embodiment, the first connection line SL-1 and the first connection pad SP-1 may be provided as a unitary shape provided by the same process. The first connection pads SP-1 may be electrically bonded to the driving circuit board PB shown in FIG. 4A.

The first connection lines SL-1 may be disposed between the first connection pads SP-1 and the driving chip DC. Ends of the first connection lines SL-1 may be connected to the first connection pads SP-1, and opposite ends of the first connection lines SL-1 may be connected to the driving chip DC.

The second conductive patterns CPL2 may be provided to face the first conductive patterns CPL1 with the driving chip DC interposed therebetween. The second conductive patterns CPL2 may include the second connection lines SL-2 and the second connection pads SP-2. In an exemplary embodiment, the second connection line SL-2 and the second connection pad SP-2 may be provided as a unitary shape provided by the same process. The second connection pads SP-2 may be in contact with the signal pads PD of the display panel DP, which are shown in FIG. 4A, by the ultrasonography bonding method.

The second connection lines SL-2 may be disposed between the second connection pads SP-2 and the driving chip DC. Ends of the second connection lines SL-2 may be connected to the second connection pads SP-2, and opposite ends of the second connection lines SL-2 may be connected to the driving chip DC.

In the specification, each of the first and second connection lines SL-1 and SL-2 may be referred to as a line portion, and each of the first and second connection pads SP-1 and SP-2 may be referred to as a pad portion.

Furthermore, the circuit board FB may further include an insulating layer SIL, which is disposed on the first base substrate BP1 to cover the first and second connection lines SL-1 and SL-2.

Referring to FIG. 6, the substrate SUB and the first base substrate BP1 may be disposed to face each other in the third direction DR3. The signal pads PD on the substrate SUB (hereinafter, referred to as 'signal pads') and the second connection pads SP-2 on the first base substrate BP1 (hereinafter, referred to as 'second connection pads') may be in contact with each other and may face each other in the third direction DR3.

As described above, the signal pad PD and the second connection pad SP-2 may be in contact with each other by the ultrasonography bonding method.

In detail, referring to FIG. 7A, the second connection pad SP-2 may consist of or include a metallic material, which may be easily bonded with the signal pad PD by the ultrasonography bonding process. In an exemplary embodiment, the second connection pad SP-2 may consist of or include copper (Cu), for example.

The signal pad PD may include a first driving conductive layer P1a, a second driving conductive layer P1b, and a third driving conductive layer P1c. The first driving conductive layer P1a may be provided on the substrate SUB. The first driving conductive layer P1a may be directly disposed on the substrate SUB. The second driving conductive layer P1b may be disposed on the first driving conductive layer P1a, and the third driving conductive layer P1c may be disposed on the second driving conductive layer P1b.

In an exemplary embodiment, the first and third driving conductive layers P1a and P1c may include the same material. In an exemplary embodiment, each of the first and third driving conductive layers P1a and P1c may include titanium (Ti), and the second driving conductive layer P1b may include aluminum (Al), for example. In an exemplary embodiment, a thickness of the second driving conductive layer P1b in the third direction DR3 may be greater than a thickness of each of the first and third driving conductive layers P1a and P1c.

The first driving conductive layer P1a including titanium may be easily bonded to the substrate SUB including glass or polyimide and the second driving conductive layer P1b including aluminum, by the ultrasonography bonding method. In addition, the third driving conductive layer P1c including titanium may be easily bonded to the second driving conductive layer P1b including aluminum, by the ultrasonography bonding method.

In an exemplary embodiment, the third driving conductive layer P1c including titanium (Ti) may be attached to the second connection pad SP-2 including copper (Cu) by the ultrasonography bonding method. Furthermore, although not shown, in the case where the second connection pad SP-2 and the third driving conductive layer P1c are connected to each other by the ultrasonography bonding process between the second connection pad SP-2 and the signal pad PD, at least a portion of the second driving conductive layer P1b may be adhered to the second connection pad SP-2.

Referring to FIG. 7B, a contact region CTA and a non-contact region NCTA adjacent to the contact region CTA may be defined in the circuit board FB. The contact region CTA may correspond to the second pad region FA2, in which the second connection pad SP-2 is disposed, and the non-contact region NCTA may correspond to the remaining region, other than the contact region CTA. In the specification, the contact region may mean a region, in which two metal materials are bonded to each other by an ultrasonography bonding technology.

In an exemplary embodiment, the circuit board FB may include a first conductive layer CL1 and a second conductive layer CL2. The first and second conductive patterns CPL1 and CPL2 of the circuit board FB may include at least one of the first and second conductive layers CL1 and CL2. The first conductive layer CL1 may be disposed on the first base substrate BP1, and the second conductive layer CL2 may be disposed on the first base substrate BP1 to cover the first conductive layer CL1.

When measured in the third direction DR3, a thickness of the first conductive layer CL1 may be greater than a thickness of the second conductive layer CL2. The first conductive layer CL1 may be a layer for the ultrasonography bonding process with the signal pad PD, and the second conductive layer CL2 may be used as a cover layer preventing the first conductive layer CL1 from being oxidized by oxygen supplied from the outside.

Hereinafter, a stacking structure of the second conductive patterns CPL2, which are bonded to the signal pad PD of the display panel DP by the ultrasonography bonding process, will be mainly described. Although not described in detail, the first conductive patterns CPL1, which are electrically bonded to the driving circuit board PB, may also have the same structure as the second conductive patterns CPL2. In this case, the circuit board FB may include a contact region, which is defined to correspond to the first connection pads SP-1 of the first conductive patterns CPL1.

In detail, the first conductive layer CL1 may include a first conductive portion CL1a corresponding to the contact region CTA and a second conductive portion CL1b corresponding to the non-contact region NCTA. The second conductive layer CL2 may include a third conductive portion CL2a, which is disposed on the first conductive portion CL1a and corresponds to the contact region CTA, and a fourth conductive portion CL2b, which is disposed on the second conductive portion CL1b and corresponds to the non-contact region NCTA.

The first conductive portion CL1a and the third conductive portion CL2a may correspond to the second connection pad SP-2, and the second conductive portion CL1b and the fourth conductive portion CL2b may correspond to the second connection line SL-2. In the specification, the second conductive portion CL1b and the fourth conductive portion CL2b of the second connection line SL-2 will be described as a conductive line layer. In an exemplary embodiment, the third conductive portion CL2a and the first conductive portion CL1a may be provided as a unitary shape provided by the same process, and the fourth conductive portion CL2b and the second conductive portion CL1b may be provided as a unitary shape provided by the same process.

In particular, the third conductive portion CL2a corresponding to the contact region CTA may have an area that is smaller than the first conductive portion CL1a, in a plan view. The third conductive portion CL2a may be overlapped with a portion of the first conductive portion CL1a, not with the entirety of the first conductive portion CL1a. In contrast, the fourth conductive portion CL2b corresponding to the non-contact region NCTA may be overlapped with the entirety of the second conductive portion CL1b. Thus, the second conductive layer CL2 may expose at least a portion of the first conductive layer CL1 corresponding to the contact region CTA.

In an exemplary embodiment, the second conductive layer CL2 may be disposed on the first base substrate BP1 to fully cover the first conductive layer CL1. Thereafter, a portion of the second conductive layer CL2 overlapped with the contact region CTA may be removed by an intense light (e.g., a laser beam), such that a portion of the first conductive portion CL1a is exposed through second conductive layer CL2 overlapping the contact region CTA, as shown in FIG. 7B.

In an exemplary embodiment, the second connection pad SP-2 corresponding to the contact region CTA may include a first connection pad portion SC1 and a second connection pad portion SC2. The first connection pad portion SC1 may correspond to a portion of the first conductive layer CL1, which is disposed in the contact region CTA and is exposed by the second conductive layer CL2. The second connection pad portion SC2 may correspond to portions of the first and second conductive layers CL1 and CL2, which are stacked in the contact region CTA and are not overlapped with the first connection pad portion SC1.

According to an exemplary embodiment of the invention, as shown in FIG. 7B, the first connection pad portion SC1 may be composed of only the first conductive layer CL1, and the second connection pad portion SC2 may be composed of the first and second conductive layers CL1 and CL2, which are stacked. As a result, when measured in the third direction DR3, a thickness of the second connection pad portion SC2 may be greater than a thickness of the first connection pad portion SC1.

In an exemplary embodiment, the first and second conductive layers CL1 and CL2 may consist of or include different materials. In an exemplary embodiment, the first conductive layer CL1 may include copper (Cu), and the second conductive layer CL2 may include tin (Sn), for example. The second conductive layer CL2 including tin (Sn) may cover the first conductive layer CL1, and thus, it may be possible to prevent the first conductive layer CL1 from being oxidized by oxygen supplied from the outside. In addition, the driving chip DC shown in FIG. 5 may be disposed on the second conductive layer CL2.

As described with reference to FIG. 7A, the first driving conductive layer P1 $a$ of the signal pad PD in contact with the second connection pad SP-2 may include titanium (Ti). In general, titanium is a metal, which may be easily bonded to copper or aluminum (Al) by the ultrasonography bonding method. However, titanium is not easily bonded to tin (Sn) by the ultrasonography bonding method.

In detail, since the first connection pad portion SC1 is composed of only a single layer of the first conductive layer CL1, it may be easy to perform the ultrasonography bonding process between the first connection pad portion SC1 and the signal pad PD. The first connection pad portion SC1 may include only the first conductive portion CL1$a$. In contrast, since the second connection pad portion SC2 has a structure, in which the first conductive portion CL1$a$ and the third conductive portion CL2$a$ are stacked, the third conductive portion CL2$a$ may face the signal pad PD. As a result, the second connection pad portion SC2 including tin (Sn) may not be easily bonded to the signal pad PD by the ultrasonography bonding process.

According to an exemplary embodiment of the invention, the second connection pad SP-2 and the signal pad PD, which are in contact with each other by the ultrasonography bonding method, may have a predetermined surface roughness (hereinafter, referred to as roughness 'Ra'). In an exemplary embodiment, due to friction between the second connection pad SP-2 and the signal pad PD caused by the ultrasonography process, an interface between the second connection pad SP-2 and the signal pad PD may become rough, for example.

A first interface between the first connection pad portion SC1 and the signal pad PD may have a first surface roughness. A second interface between the second connection pad portion SC2 and the signal pad PD may have a second surface roughness. The surface roughness may be measured based on International Standards (ISO 1302:1992) summarized in the following table 1. A relationship between the surface roughness Ra and the roughness grade number is as follows:

TABLE 1

| Surface Roughness Ra | | Roughness Grade |
|---|---|---|
| μm | μin | Numbers |
| 50 | 2000 | N12 |
| 20 | 1000 | N11 |
| 12.5 | 500 | N10 |

TABLE 1-continued

| Surface Roughness Ra | | Roughness Grade |
|---|---|---|
| μm | μin | Numbers |
| 6.3 | 250 | N9 |
| 3.2 | 125 | N8 |
| 1.6 | 63 | N7 |
| 0.8 | 32 | N6 |
| 0.4 | 26 | N5 |
| 0.2 | 8 | N4 |
| 0.1 | 4 | N3 |
| 0.05 | 2 | N2 |
| 0.025 | 1 | N1 |

According to an exemplary embodiment of the invention, the first surface roughness may be greater than the second surface roughness. The first conductive portion CL1$a$ corresponding to the first connection pad portion SC1 may include copper (Cu), and the third conductive portion CL2$a$ corresponding to the second connection pad portion SC2 may include tin (Sn). In the ultrasonography process, the friction between copper (Cu) and titanium (Ti) may occur more actively than that between tin (Sn) and titanium (Ti). Thus, the first surface roughness between the first connection pad portion SC1 and the signal pad PD may be greater than the second surface roughness between the second connection pad portion SC2 and the signal pad PD. As shown in FIGS. 6 and 7B, the circuit board FB may further include a sub-conductive layer CL2$s$, which is disposed on a side surface of the first conductive portion CL1$a$ corresponding to the first connection pad portion SC1. The sub-conductive layer CL2$s$ may be provided by the same process as that for the second conductive layer CL2 and may include the same material (i.e., tin (Sn)) as the second conductive layer CL2.

As shown in FIG. 6, a height TH1 of the sub-conductive layer CL2$s$ may be smaller than a thickness TH2 of the first conductive portion CL1$a$ overlapped with the first connection pad portion SC1, when measured in the third direction DR3, and in this case, it may be possible to facilitate the ultrasonography bonding process between the first conductive portion CL1$a$ and the signal pad PD.

In the illustrated exemplary embodiment, the third conductive portion CL2$a$ overlapped with the contact region CTA is described to be disposed on the first conductive portion CL1$a$, but the invention is not limited to this example. In an exemplary embodiment, the second conductive layer CL2 may be provided to fully expose a portion of the first conductive layer CL1 overlapped with the contact region CTA, for example.

Figure 8:
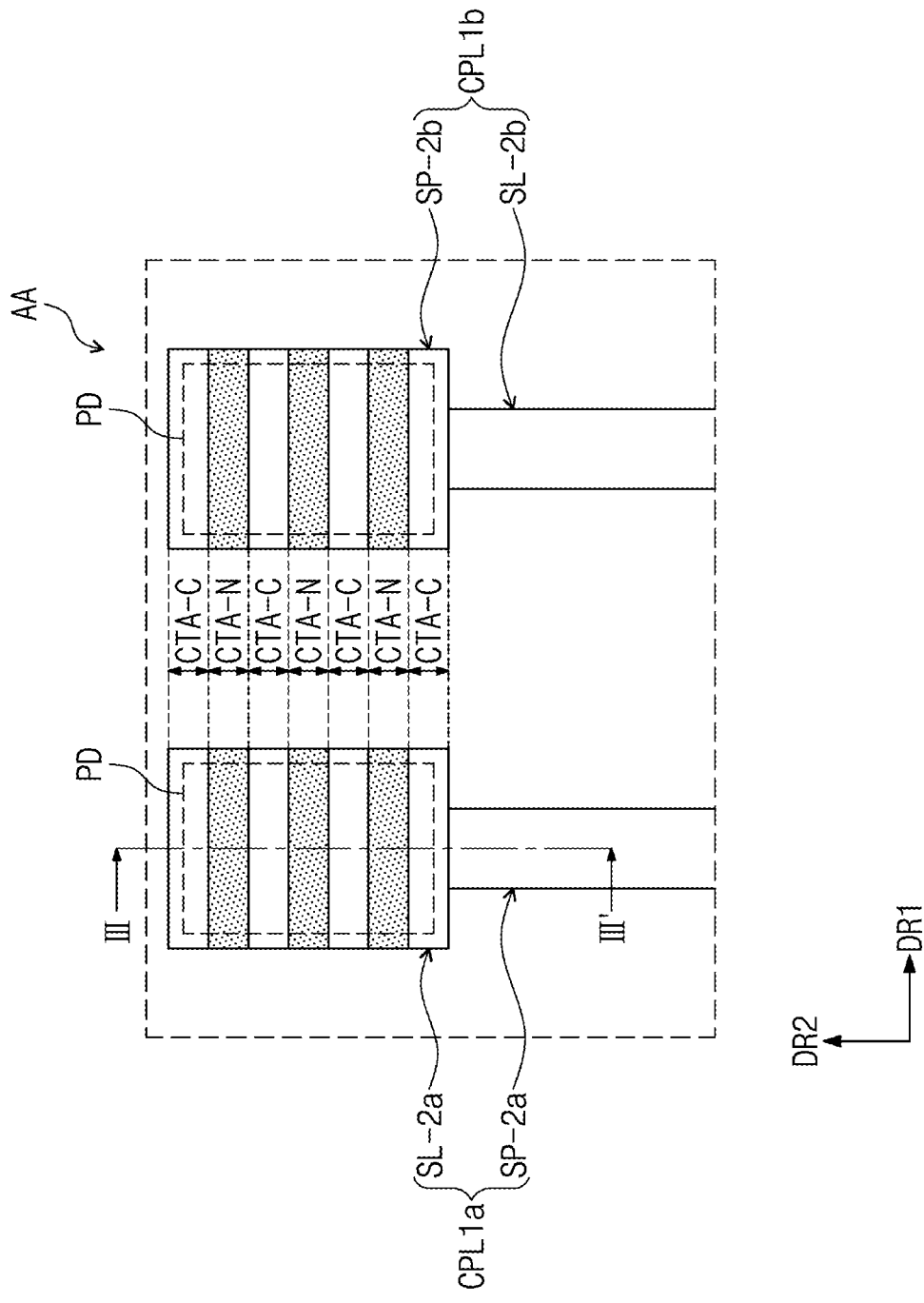
FIG. 8 is an enlarged view illustrating an exemplary embodiment of a portion 'AA' of FIG. 5, according to the invention.
Figure 9:
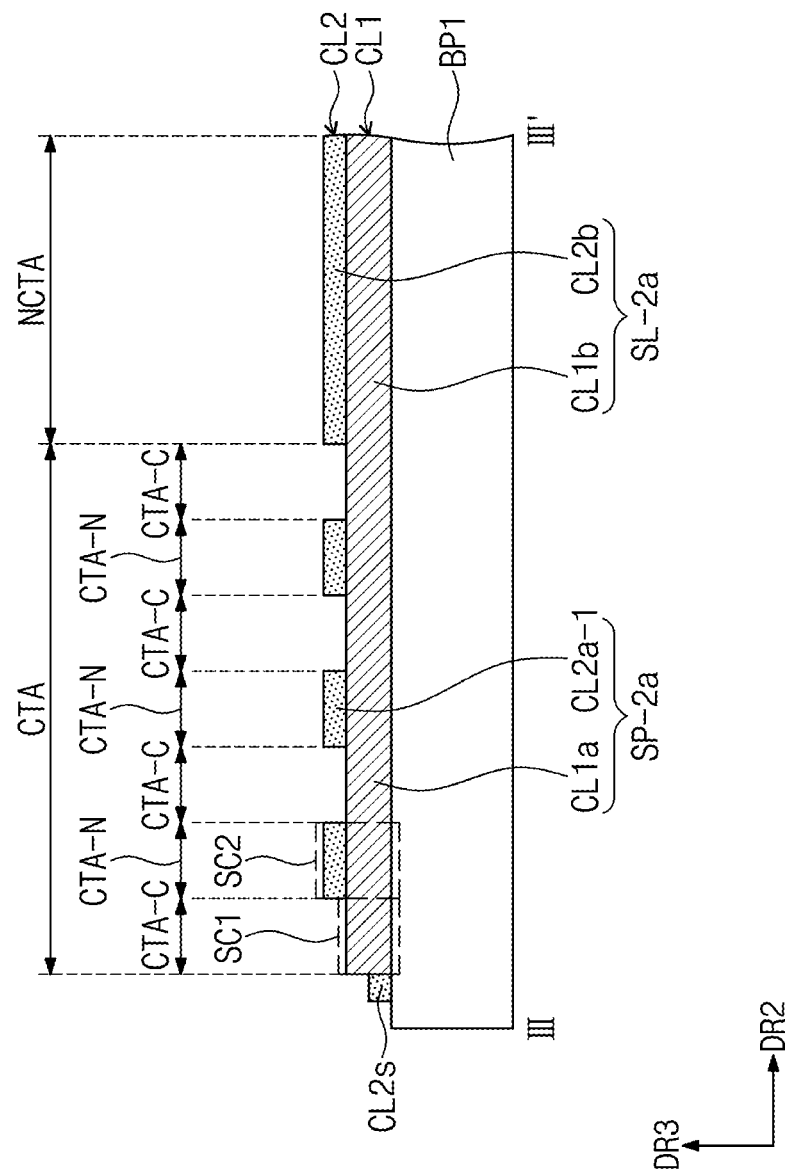
FIG. 9 is a cross-sectional view of another exemplary embodiment of a circuit board according to the invention, taken along line of FIG. 8.

FIG. 8 is an enlarged view illustrating another exemplary embodiment of a portion 'AA' of FIG. 5, according to the invention. FIG. 9 is a cross-sectional view of another exemplary embodiment of a circuit board according to the invention, taken along line of FIG. 8.

The first conductive patterns CPL1$a$ and CPL1$b$ shown in FIGS. 8 and 9 may have substantially the same structure as the first conductive patterns CPL1 shown in FIG. 7B, except for a difference in shape of the second connection pads SP-2$a$ and SP2-$b$. Thus, for concise description, overlapping description of previously described elements may be omitted.

In an exemplary embodiment, to improve the connection reliability in the ultrasonography bonding process, each of the second connection pads SP-2$a$ and SP2$b$ may have a larger area than the signal pad PD, in a plan view. Accordingly, a contact area between the first connection pad portion SC1 of each of the second connection pads SP-2*a* and SP2*b* and the signal pad PD may be increased. However, the invention is not limited to this example, and in another exemplary embodiment, each of the second connection pads SP-2*a* and SP2*b* may be provided to have the same area as the signal pad PD, in a plan view.

Referring to FIG. 8, each of the second connection pads SP-2*a* and SP-2*b* may be overlapped with the contact region CTA. In particular, the contact region CTA may include a first sub-region CTA-C and a second sub-region CTA-N. The first and second sub-regions CTA-C and CTA-N may be alternately and repeatedly arranged in the second direction DR2.

In detail, referring to FIG. 9, the first sub-region CTA-C may correspond to the first connection pad portion SC1 of FIG. 7B, and the second sub-region CTA-N may correspond to the second connection pad portion SC2 of FIG. 7B. The first connection pad portion SC1 may have a single-layered structure of the first conductive portion CL1*a*, and the second connection pad portion SC2 may have a structure, in which the first conductive portion CL1*a* and a third conductive portion CL2*a*-1 are stacked.

Thus, the first and second connection pad portions SC1 and SC2 may be alternately and repeatedly arranged in the second direction DR2. Here, the first conductive layer CL1 overlapped with the contact region CTA may be provided as a unitary shape, which is extended in the second direction DR2. In contrast, the second conductive layer CL2 overlapped with the contact region CTA may include portions, which are spaced apart from each other by a predetermined distance in the second direction DR2.

In an exemplary embodiment, the second conductive layer CL2 may be disposed on the first base substrate BP1 to fully cover the first conductive layer CL1. Thereafter, as shown in FIG. 9, to form the third conductive portion CL2*a*-1 exposing a portion of the first conductive portion CL1*a*, a portion of the second conductive layer CL2 overlapped with the contact region CTA may be removed by a laser beam. In this case, the laser beam may be irradiated onto portions of the second conductive layer CL2, which are spaced apart from each other by a predetermined distance in the second direction DR2.

Figure 10:
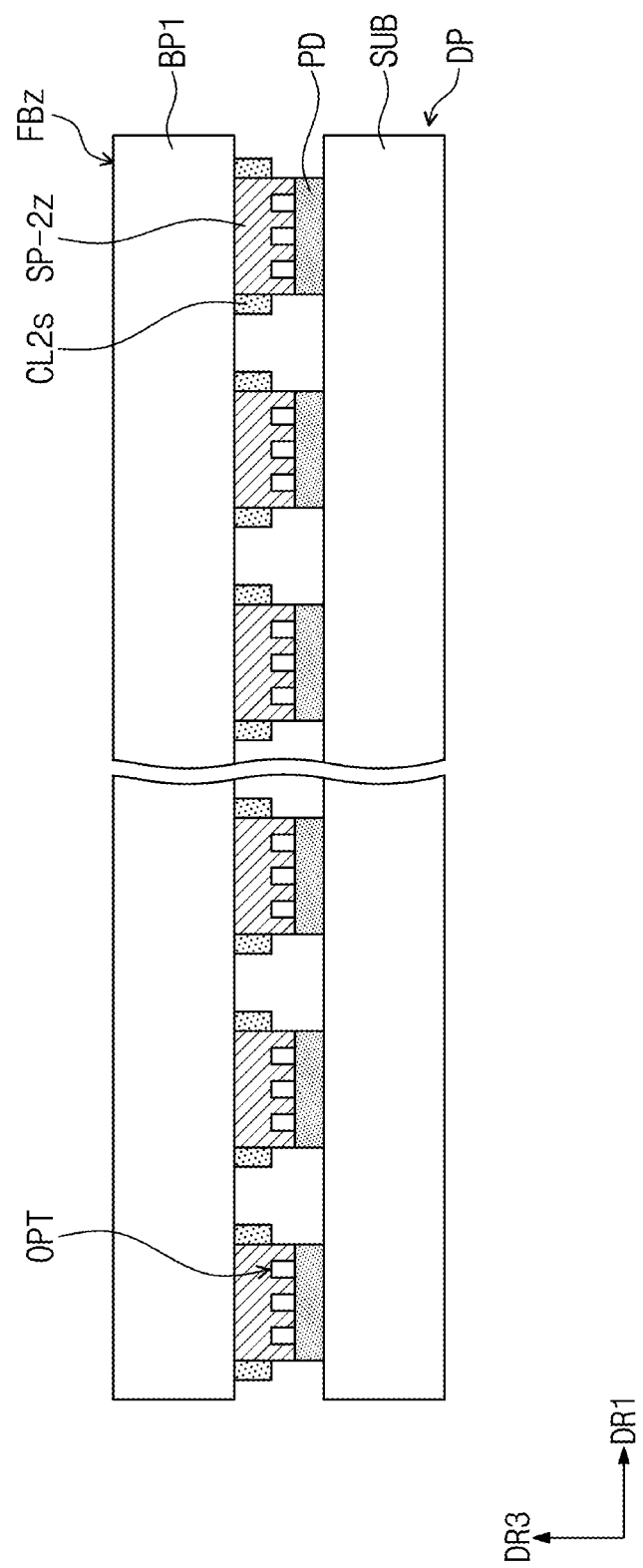
FIGS. 10 and 11 are cross-sectional views illustrating another exemplary embodiment of a display device according to the invention.
Figure 11:
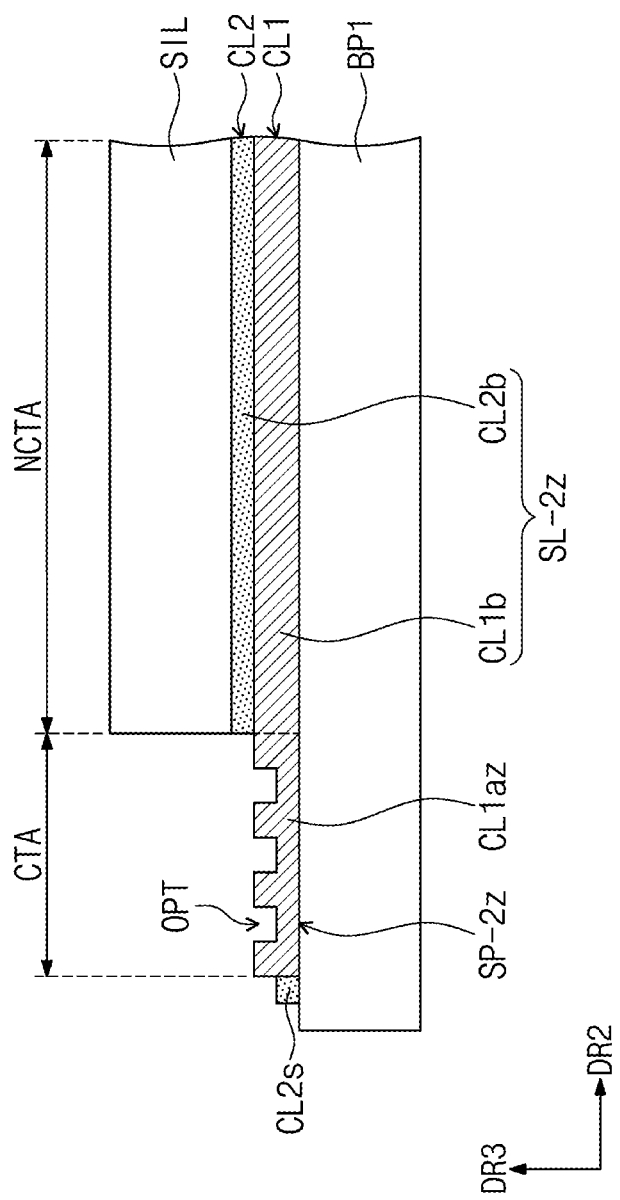

FIGS. 10 and 11 are cross-sectional views illustrating another exemplary embodiment of a display device according to the invention.

A circuit board FBz shown in FIG. 10 may have substantially the same structure as the circuit board FB shown in FIGS. 6 and 7B, except for a difference in shape of a second connection pad SP-2*z*. Thus, for concise description, overlapping description of previously described elements may be omitted.

Referring to FIGS. 10 and 11, the second connection pad SP-2*z* may have a single-layered structure, which consists of the first conductive portion CL1*az* of the first conductive layer CL1 overlapped with the contact region CTA. A second connection line SL-2*z* may have a stacking structure including the second conductive portion CL1*b* of the first conductive layer CL1, which is overlapped with the noncontact region NCTA, and the fourth conductive portion CL2*b* of the second conductive layer CL2, which is disposed on the second conductive portion CL1*b*. However, the invention is not limited to this example, and in another exemplary embodiment, the second connection pad SP-2*z* may include a portion of the second conductive layer CL2, which is overlapped with the contact region CTA but is disposed to expose the first conductive layer CL1, as shown in FIG. 7B.

In an exemplary embodiment, a recessed space OPT, which is overlapped with the contact region CTA and is recessed in the third direction DR3, may be defined in the first conductive layer CL1. In an exemplary embodiment, at least one recessed space OPT, which is recesses in a direction from a top surface of the second connection pad SP-2*z* facing the signal pad PD of the display panel DP toward a bottom surface of the second connection pad SP-2*z* facing the first base substrate BP1, may be defined in the second connection pad SP-2*z*, for example.

Due to the recessed space OPT defined in the second connection pad SP-2*z*, friction between the signal pad PD and the second connection pad SP-2*z* may be enhanced during the ultrasonography bonding process between the signal pad PD and the second connection pad SP-2*z*. This may result in an increase in surface roughness between the signal pad PD and the second connection pad SP-2*z*.

In the case where, as shown in FIG. 7B, the circuit board FBz includes a portion of the second conductive layer CL2, which is overlapped with the contact region CTA but is disposed to expose the first conductive layer CL1, the recessed space OPT may not be overlapped with the portion of the second conductive layer CL2, unlike the structure illustrated in FIG. 11.

FIGS. 12A to 12D are cross-sectional views illustrating an exemplary embodiment of a method of fabricating a circuit board according to the invention.

Figure 12A:
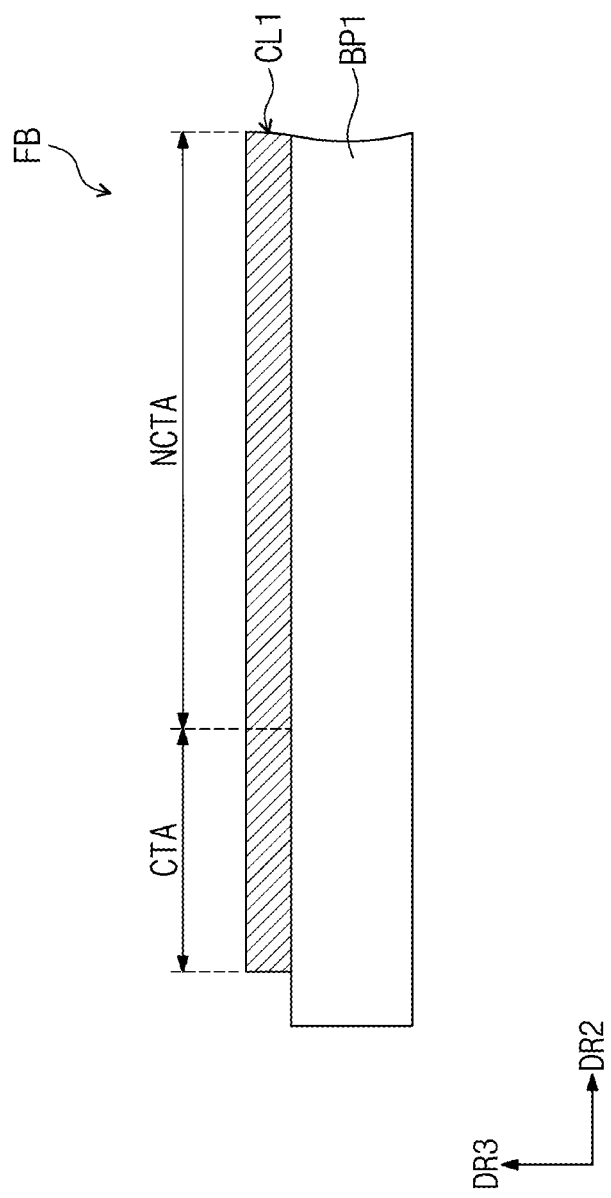
FIGS. 12A to 12D are cross-sectional views illustrating an exemplary embodiment of a method of fabricating a circuit board according to the invention.

Referring to FIG. 12A, the first conductive layer CL1 may be disposed on the first base substrate BP1. Thereafter, the first conductive layer CL1 may be patterned to have the same shapes as those of the first and second conductive patterns CPL1 and CPL2 shown in FIG. 5.

Figure 12B:
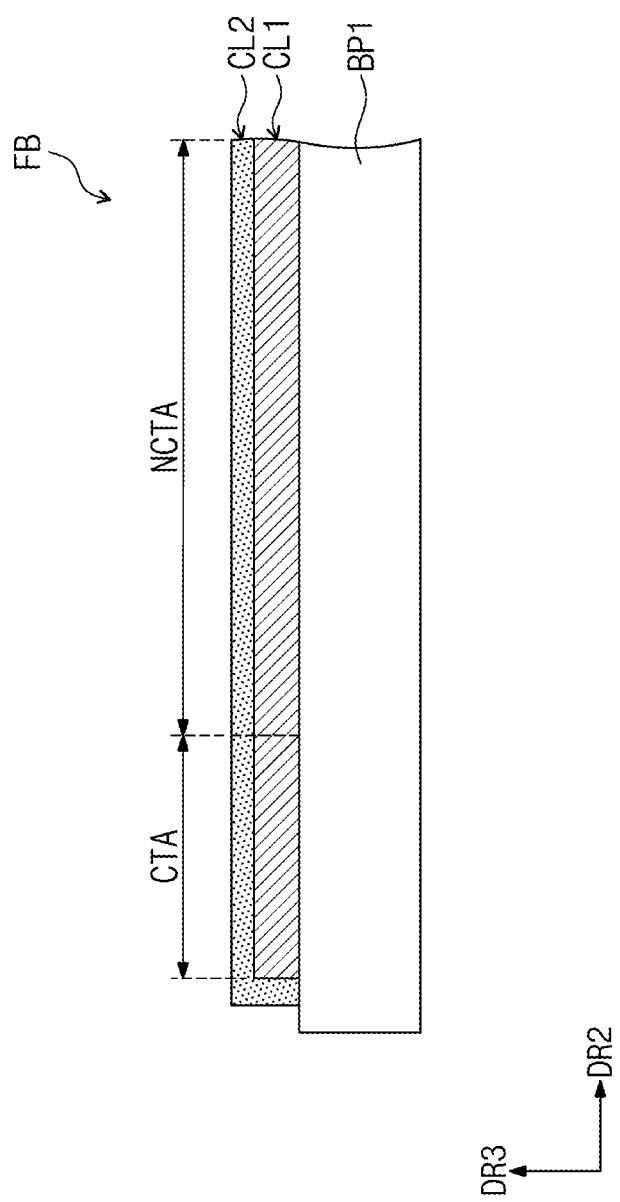

Thereafter, as shown in FIG. 12B, the second conductive layer CL2 may be disposed on a first base substrate BP1 to cover the first conductive layer CL1. The second conductive layer CL2 may be provided by dipping the first base substrate BP1, on which the first conductive layer CL1 is disposed, into a container filled with a material for the second conductive layer CL2.

The material in the container may be tin (Sn), and in this case, the second conductive layer CL2 may be disposed on the first conductive layer CL1 but may not be disposed on the first base substrate BP1 including silicon. As a result, the second conductive layer CL2 may be disposed on the first base substrate BP1 to have a shape corresponding to the first conductive layer CL1.

Figure 12C:
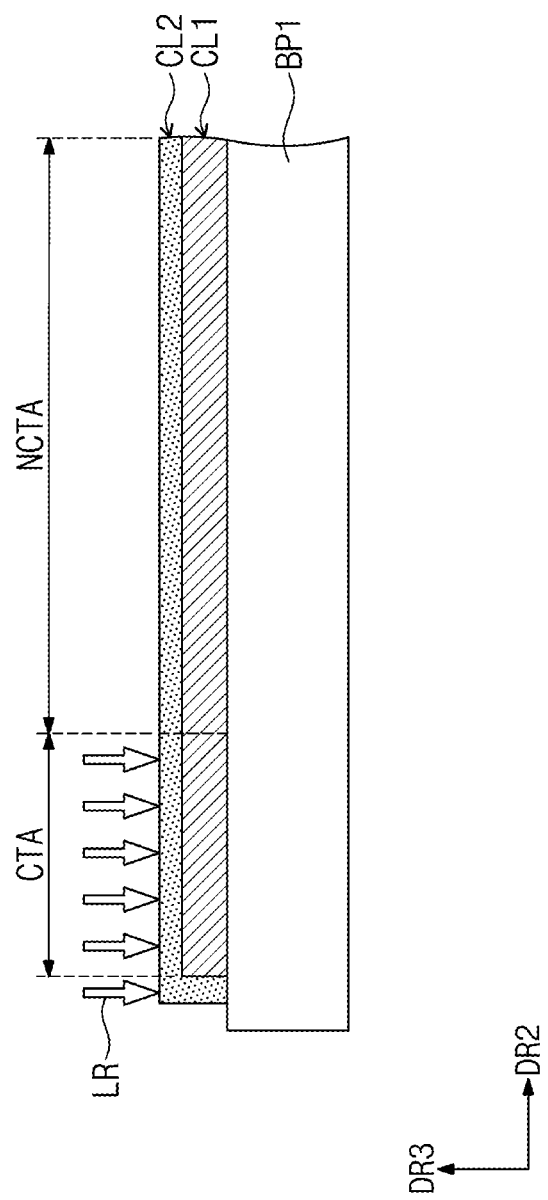

Thereafter, as shown in FIG. 12C, at least a portion of the second conductive layer CL2, which is overlapped with the contact region CTA, may be removed by an intense light (e.g., a laser beam LR). As a result, a portion of the first conductive layer CL1, which is overlapped with the contact region CTA, may be exposed through the removed portion of the second conductive layer CL2.

In an exemplary embodiment, the second conductive layer CL2, which is overlapped with the contact region CTA, may be fully removed by the laser beam LR. In this case, the signal pad PD of the display panel DP may face the first conductive layer CL1 overlapped with the contact region CTA, during the ultrasonography bonding process.

In exemplary embodiments, the second conductive layer CL2, which is overlapped with the contact region CTA, may be partially removed by the laser beam LR. According to this exemplary embodiment, the resulting structure may have a shape corresponding to the second connection pad shown in FIG. 7B or 9. In this case, the signal pad PD of the display panel DP may face each of the first and second conductive layers CL1 and CL2, which are overlapped with the contact region CTA, during the ultrasonography bonding process.

Also, the first conductive layer CL1 may be partially removed by the laser beam LR. In an exemplary embodiment, the recessed space OPT, which is defined in the second connection pad of FIG. 10, may be provided by the laser beam LR, for example. In this case, an intensity of the laser beam LR, which is irradiated onto the first conductive layer CL1, may be greater than an intensity of the laser beam LR, which is irradiated onto the second conductive layer CL2 overlapped with the contact region CTA.

Figure 12D:
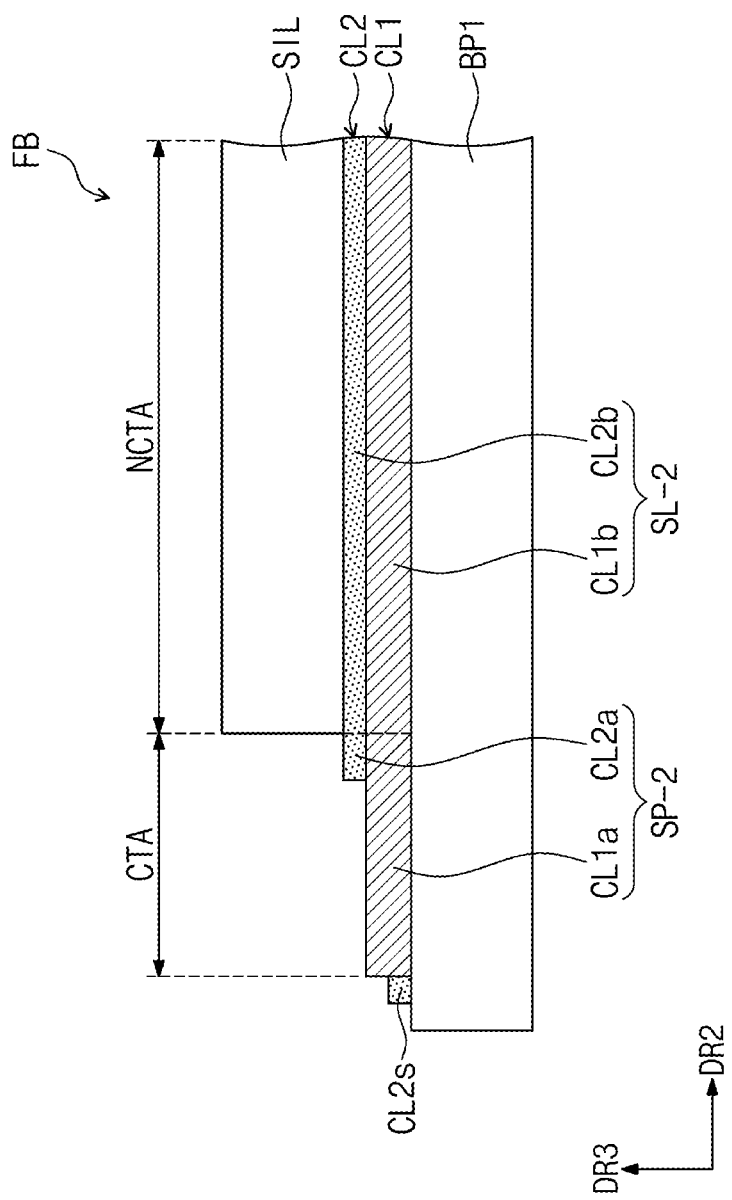

Referring to FIG. 12D, since the at least portion of the second conductive layer CL2, which is overlapped with the contact region CTA, is removed by the laser beam LR, the first conductive layer CL1 may be partially exposed. The second conductive layer CL2 is illustrated to include a portion overlapped with the contact region CTA, but in an exemplary embodiment, such a portion of the second conductive layer CL2 may be omitted.

Furthermore, since the second conductive layer CL2 overlapped with the contact region CTA is partially removed by the laser beam LR, the second conductive layer CL2 may be divided into the sub-conductive layer CL2s and the fourth conductive portion CL2b.

According to some exemplary embodiments of the invention, a connection pad of a circuit board and a signal pad of a display panel are provided to be in contact with each other through a ultrasonography bonding process, and thus, the reliability in connection between the display panel and the circuit board may be improved.

While exemplary embodiments of the invention have been particularly shown and described, it will be understood by one of ordinary skill in the art that variations in form and detail may be made therein without departing from the spirit and scope of the attached claims.

What is claimed is:

1. A display device, comprising:
a display panel including a signal pad; and
a circuit board comprising a connection pad including a first connection pad portion and a second connection pad portion, which is thicker than the first connection pad portion and is not overlapped with the first connection pad portion in a plan view,
wherein the connection pad is in contact with the signal pad; and
wherein a first surface roughness between the first connection pad portion and the signal pad is greater than a second surface roughness between the second connection pad portion and the signal pad.

2. The display device of claim 1, wherein the connection pad comprises a first conductive layer and a second conductive layer, which is disposed on the first conductive layer to expose a portion of the first conductive layer,
the first connection pad portion corresponds to the portion of the first conductive layer exposed by the second conductive layer, and
the second connection pad portion corresponds to a structure, in which the first and second conductive layers are stacked.

3. The display device of claim 2, wherein the first conductive layer is thicker than the second conductive layer.

4. The display device of claim 2, wherein the circuit board further comprises a sub-conductive layer, which is disposed on a side surface of the first connection pad portion and comprises a same material as a material of the second conductive layer.

5. The display device of claim 4, wherein, in a thickness direction of the display panel, a height of the sub-conductive layer is smaller than a thickness of the first conductive layer.

6. The display device of claim 2, wherein the first and second connection pad portions are alternately and repeatedly arranged in a first direction in which the connection pad extends.

7. The display device of claim 6, wherein the first conductive layer is extended in the first direction as a unitary shape, and
the second conductive layer includes portions, which are arranged in the first direction to be spaced apart from each other by a predetermined distance.

8. The display device of claim 2, wherein the first conductive layer comprises a material different from a material of the second conductive layer.

9. The display device of claim 2, wherein the circuit board further comprises:
a base substrate, on which the connection pad is disposed;
a driving chip disposed on the base substrate; and
a connection line disposed on the base substrate to electrically connect the connection pad to the driving chip,
wherein the connection line comprises a first conductive line layer corresponding to the first conductive layer and a second conductive line layer corresponding to the second conductive layer.

10. The display device of claim 9, wherein the first conductive line layer and the first conductive layer are unitarily shaped, and
the second conductive line layer and the second conductive layer are unitarily shaped.

11. The display device of claim 2, wherein the first conductive layer comprises copper, and the second conductive layer comprises tin.

12. The display device of claim 1, wherein, in the plan view, an area of the first connection pad portion is greater than an area of the signal pad.

13. A display device, comprising:
a display panel, in which a display region and a non-display region adjacent to the display region are defined, the display panel comprising a signal pad overlapped with the non-display region; and
a circuit board electrically connected to the display panel overlapped with the non-display region, the circuit board comprising a conductive pattern including a pad portion, which faces the signal pad and is in contact with the signal pad, and a line portion, which is not overlapped with the signal pad and is connected to the pad portion,
wherein, in a thickness direction of the display panel, a recessed space, which is recessed in a direction from a first surface of the pad portion facing the signal pad toward a second surface facing the first surface, is defined in the pad portion.

14. The display device of claim 13, wherein the pad portion comprises:
a first conductive layer; and
a second conductive layer, which is disposed on the first conductive layer to expose a portion of the first conductive layer,
wherein the recessed space is defined in the portion of the first conductive layer exposed by the second conductive layer.

15. The display device of claim 14, wherein a first surface roughness between the signal pad and the exposed portion of the first conductive layer, which are in contact with each other, is greater than a second surface roughness between the signal pad and the second conductive layer, which are in contact with each other.

16. The display device of claim 14, wherein the line portion comprises:
   a first line conductive layer having a unitary shape in conjunction with the first conductive layer; and
   a second line conductive layer disposed on the first line conductive layer and having a unitary shape in conjunction with the second conductive layer.

17. The display device of claim 14, wherein the first conductive layer is thicker than the second conductive layer, and
   the first conductive layer comprises a material different from a material of the second conductive layer.

18. A method of fabricating a circuit board, the method comprising:
   preparing a base substrate, in which a pad region and a line region are defined, the pad region and the line region being divided into each other in a plan view;
   forming a first conductive layer on the base substrate;
   removing a region of the first conductive layer, which is not overlapped with the pad region and the line region;
   forming a second conductive layer on the base substrate to cover the first conductive layer; and
   removing a region of the second conductive layer, which is overlapped with the pad region, using an intense light,
   wherein, as a result of the using the intense light, a portion of the first conductive layer overlapped with the pad region is exposed by the second conductive layer.

19. The method of claim 18, further comprising irradiating the intense light onto a first surface of the first conductive layer, which is overlapped with the pad region,
   wherein a recessed space, which is recessed in a direction from the first surface of the first conductive layer toward a second surface facing the first surface, is defined in the first conductive layer, as a result of the using the intense light.

20. The method of claim 19, wherein the first conductive layer and the second conductive layer include different materials from each other, and
   the second conductive layer exposes a portion of the base substrate, which is not overlapped with the first conductive layer.

* * * * *